(12) United States Patent
Liu et al.

(10) Patent No.: US 12,009,316 B2
(45) Date of Patent: Jun. 11, 2024

(54) SEMICONDUCTOR STRUCTURE AND METHOD OF MANUFACTURING A SEMICONDUCTOR STRUCTURE

(71) Applicant: TAIWAN SEMICONDUCTOR MANUFACTURING COMPANY LTD., Hsinchu (TW)

(72) Inventors: Hsien-Wen Liu, Hsinchu (TW); Hsien-Wei Chen, Hsinchu (TW); Jie Chen, New Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 1 day.

(21) Appl. No.: 17/244,800

(22) Filed: Apr. 29, 2021

(65) Prior Publication Data

US 2022/0352089 A1 Nov. 3, 2022

(51) Int. Cl.
| | |
|---|---|
| *H01L 23/00* | (2006.01) |
| *H01L 21/48* | (2006.01) |
| *H01L 21/56* | (2006.01) |
| *H01L 23/31* | (2006.01) |
| *H01L 23/538* | (2006.01) |

(52) U.S. Cl.
CPC ........ *H01L 23/562* (2013.01); *H01L 21/4853* (2013.01); *H01L 21/4857* (2013.01); *H01L 21/563* (2013.01); *H01L 21/565* (2013.01); *H01L 21/568* (2013.01); *H01L 23/3128* (2013.01); *H01L 23/3135* (2013.01); *H01L 23/5383* (2013.01); *H01L 23/5386* (2013.01); *H01L 24/16* (2013.01); *H01L 2224/16227* (2013.01); *H01L 2924/18161* (2013.01); *H01L 2924/3511* (2013.01)

(58) Field of Classification Search
CPC . H01L 23/562; H01L 25/042; H01L 25/0655; H01L 25/072; H01L 25/0753; H01L 25/115
See application file for complete search history.

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |

(Continued)

*Primary Examiner* — Evan G Clinton
(74) *Attorney, Agent, or Firm* — WPAT LAW; Anthony King

(57) ABSTRACT

A semiconductor structure includes a first die having a first surface and a second surface opposite to the first surface, a conductive bump disposed at the first surface, and an RDL under the conductive bump. The RDL includes an interconnect structure and a dielectric layer, and the interconnect structure is electrically connected to the first die through the conductive bump. The semiconductor structure further includes a molding over the RDL and surrounding the first die and the conductive bump, an adhesive over the molding and the second surface, and a support element over the adhesive. A method includes providing a first die having a first surface and a second surface, a redistribution layer over the first surface, and a molding surrounding the first die; removing a portion of the molding to expose the second surface; and attaching a support element over the molding and the second surface.

20 Claims, 21 Drawing Sheets

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2018/0138101 A1* | 5/2018 | Yu | H01L 23/3114 |
| 2020/0006181 A1* | 1/2020 | Chen | H01L 24/29 |
| 2020/0006251 A1* | 1/2020 | Chen | H01L 23/5381 |
| 2022/0013474 A1* | 1/2022 | Yoo | H01L 25/0655 |

* cited by examiner

SEMICONDUCTOR STRUCTURE AND METHOD OF MANUFACTURING A SEMICONDUCTOR STRUCTURE

BACKGROUND

The semiconductor industry has experienced rapid growth due to ongoing improvements in integration density of a variety of components (e.g., dies, chips, etc.). To accommodate the miniaturized scale of the semiconductor devices, various technologies and applications have been developed for wafer-level packaging, involving greater numbers of different components with different functions. Improvement in integration density has resulted from iterative reduction of minimum feature size, which allows more components to be integrated into a given area.

As such, fabrication of the semiconductor device involves many steps and operations on such a small and thin semiconductor device. Therefore, the manufacturing of the semiconductor device at a miniaturized scale becomes more complicated and more difficult, which adversely affects the yield of the packaging.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
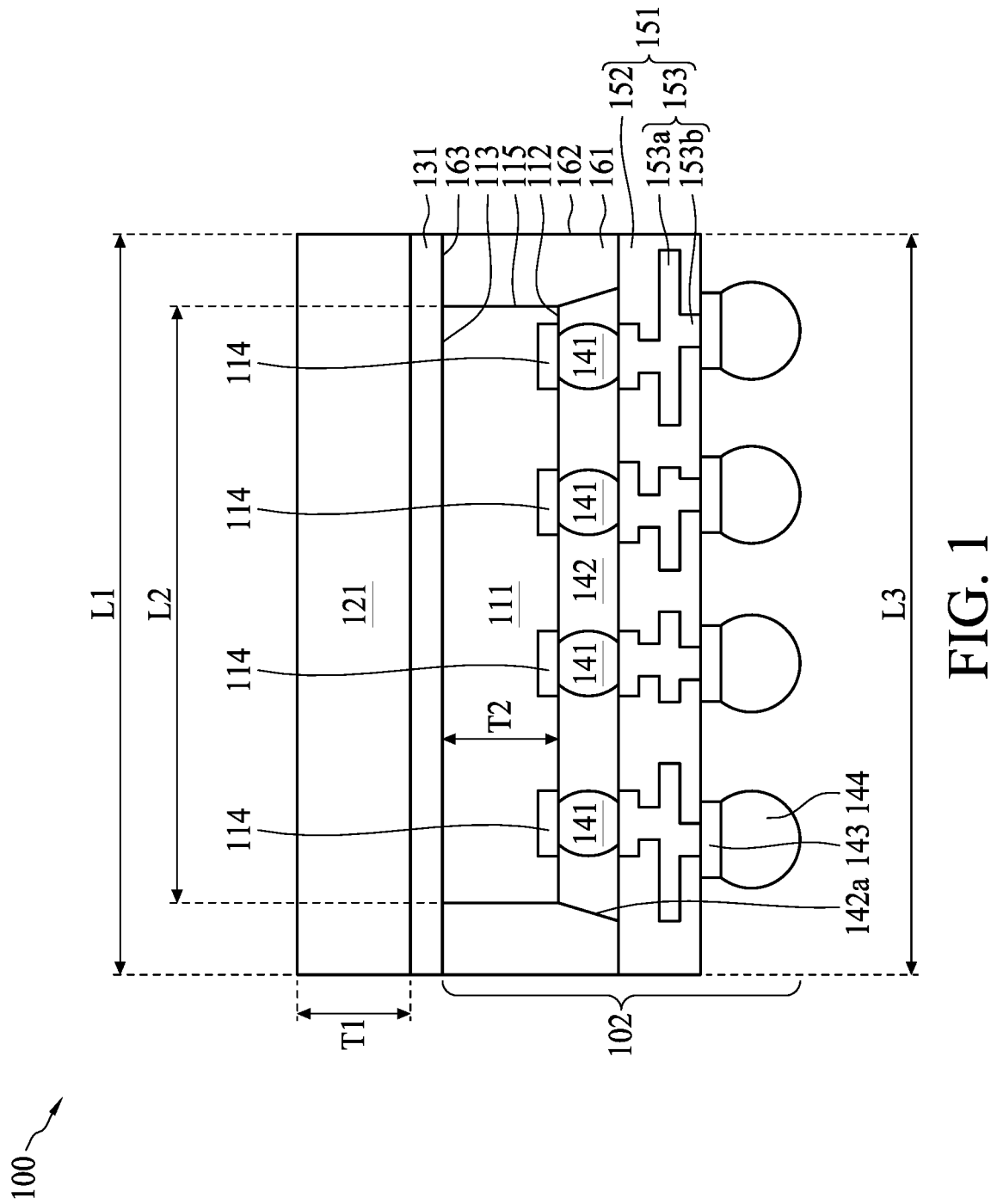
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. In addition, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3D IC devices. The testing structures may include, for example, test pads formed in a redistribution layer or on a substrate that allow the testing of the 3D packaging or 3D IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase yield and decrease costs.

A semiconductor structure is manufactured using a number of operations. During the manufacturing of the semiconductor structure, components such as semiconductor chips or dies with different functionalities and dimensions are adjacent to each other and integrated into a single module. The components are disposed on a redistribution layer (RDL), and a molding is formed to encapsulate the components.

During packing of the semiconductor structure, such as forming a fan-out package, I/O pads on the component can be redistributed to an area greater than that of the component. However, as semiconductor technologies evolve, components are increasingly becoming smaller, and the fan-out package suffers from warpage. Warpage causes difficulty in bonding of the fan-out package to a package substrate, and the respective solder joint may fail. Therefore, a support element included in the semiconductor structure helps to reduce warpage and improve the reliability of the semiconductor structure.

In the present disclosure, a semiconductor structure and a method of manufacturing a semiconductor structure are provided. Further, a semiconductor structure including a first die, a conductive bump, a redistribution layer, a molding, an adhesive, and a support element is disclosed below. In addition, a method of manufacturing a semiconductor structure including attaching a support element over a molding and a first die is also disclosed below. Other features and processes are also included in some embodiments. The semiconductor structure includes the support element configured to reduce warpage, in order to improve reliability of the semiconductor structure.

FIG. 1 is a cross-sectional view of a semiconductor structure 100 in accordance with some embodiments of the present disclosure. In some embodiments, referring to FIG. 1, the semiconductor structure 100 includes a first die 111, a support element 121, an adhesive 131, a first conductive bump 141, a redistribution layer (RDL) 151, and a molding 161.

In some embodiments, the first die 111 has a first surface 112 and a second surface 113 opposite to the first surface 112. In some embodiments, the first surface 112 is a front side of the first die 111, and the second surface 113 is a back side of the first die 111. In some embodiments, the first die 111 includes integrated circuit devices (such as active devices, which include transistors, for example) at the first surface 112. In some embodiments, the first die 111 includes a semiconductor substrate and several circuitries thereon. In some embodiments, the first die 111 is a logic die, which may be a central processing unit (CPU) die, a graphic processing unit (GPU) die, a mobile application die, a micro control unit (MCU) die, an input-output (IO) die, a baseband (BB) die, an application processor (AP) die, or the like.

In some embodiments, the first die 111 includes a plurality of conductive members 114 such as pads. In some embodiments, the conductive members 114 form a circuitry within the first die 111. In some embodiments, the conductive members 114 are electrically connected to the integrated circuit devices. In some embodiments, the conductive members 114 include gold, silver, copper, nickel, tungsten, aluminum, palladium and/or alloys thereof. In some embodiments, the conductive members 114 are exposed through the first surface 112 of the first die 111.

In some embodiments, the first conductive bump 141 is disposed at the first surface 112 of the first die 111. In some embodiments, a plurality of the first conductive bumps 141 are disposed at the first surface 112 of the first die 111 and electrically connected to the conductive members 114 respectively. In some embodiments, the first conductive bumps 141 are disposed between the RDL 151 and the first die 111. In some embodiments, the first conductive bump 141 includes conductive material such as solder, copper, nickel, gold or the like. In some embodiments, the first conductive bump 141 is a solder ball, a ball grid array (BGA) ball, a controlled collapse chip connection (C4) bump, a pillar or the like. In some embodiments, the first conductive bump 141 has a spherical, hemispherical or cylindrical shape.

In some embodiments, an underfill 142 is disposed under the first die 111 and disposed between the RDL 151 and the first surface 112 of the first die 111. In some embodiments, the underfill 142 surrounds the first conductive bump 141. In some embodiments, the underfill 142 is in contact with the first surface 112 of the first die 111. In some embodiments, the underfill 142 has a slanted sidewall 142a. The underfill 142 includes organic resin and/or dielectric material.

In some embodiments, the RDL 151 is disposed under the first conductive bumps 141 and the underfill 142, and a bump pad 143 and a second conductive bump 144 are disposed under the RDL 151. The RDL 151 includes an interconnect structure 153 and a dielectric layer 152 surrounding the interconnect structure 153. The interconnect structure 153 is electrically connected to the first die 111 through the first conductive bump 141. In some embodiments, the RDL 151 is a front side RDL.

In some embodiments, the dielectric layer 152 is a single dielectric layer. In some embodiments, the dielectric layer 152 comprises multiple dielectric layers. In some embodiments, the dielectric layer 152 includes dielectric material such as silicon oxide, silicon nitride, undoped silicon glass or the like. In some embodiments, the dielectric layer 152 includes polymeric material such as polyimide (PI), polybenzoxazole (PBO) or the like. In some embodiments, the dielectric layer 152 includes several dielectric layers with dielectric materials different from or same as each other.

In some embodiments, the interconnect structure 153 is surrounded by the dielectric layer 152. In some embodiments, the interconnect structure 153 extends within the dielectric layer 152. In some embodiments, the interconnect structure 153 extends through one or more layers of the dielectric layer 152. In some embodiments, the interconnect structure 153 is electrically connected to the first conductive bump 141 and the conductive members 114 of the first die 111. In some embodiments, the interconnect structure 153 is directly coupled with the first conductive bump 141. In some embodiments, the interconnect structure 153 is electrically connected to the bump pad 143 and the second conductive bump 144. In some embodiments, the interconnect structure 153 includes conductive material such as gold, silver, copper, nickel, tungsten, aluminum, tin and/or alloys thereof.

In some embodiments, the interconnect structure 153 includes a plurality of pad portions 153a disposed under and electrically connected to the first conductive bump 114. In some embodiments, the interconnect structure 153 further includes a plurality of via portions 153b disposed under and electrically connected to one or more pad portions 153a.

In some embodiments, the bump pad 143 is disposed under the RDL 151. In some embodiments, the bump pad 143 is disposed under the dielectric layer 152 and electrically connected to the interconnect structure 153. In some embodiments, the bump pad 143 is configured to receive a conductive member or the like. In some embodiments, the bump pad 143 includes an under bump metallization (UBM) pad. In some embodiments, the bump pad 143 is electrically connected to the first die 111 through the interconnect structure 153 and the first conductive bump 141. In some embodiments, the bump pad 143 is electrically connected to the conductive members 114 of the first die 111. In some embodiments, the bump pad 143 includes gold, silver, copper, nickel, tungsten, aluminum, palladium and/or alloys thereof. In some embodiments, the bump pad 143 is omitted.

In some embodiments, the second conductive bump 144 is disposed under the RDL 151 and electrically connected to the interconnect structure 153. In some embodiments, the second conductive bump 144 is disposed under the bump pad 143. In some embodiments, the second conductive bump 144 includes conductive material such as solder, copper, nickel, gold or the like. In some embodiments, the second conductive bump 144 is a solder ball, a ball grid array (BGA) ball, a controlled collapse chip connection (C4) bump, a pillar or the like. In some embodiments, the second conductive bump 144 has a spherical, hemispherical or cylindrical shape.

The molding 161 surrounds the first die 111. In some embodiments, the molding 161 is disposed on the RDL 151 and surrounds the first die 111 and the underfill 142. In some embodiments, the molding 161 is in contact with the sidewall 142a of the underfill 142. In some embodiments, the molding 161 is in contact with an edge 115 of the first die 111, and the molding leaves the second surface 113 of the first die 111 exposed. In some embodiments, the molding 161 is in contact with a portion of the RDL 151. In some embodiments, the molding 161 is in contact with a portion of the dielectric layer 152. In some embodiments, the molding 161 includes a single-layer film or a composite stack.

In some embodiments, the molding 161 has a high thermal conductivity, a low moisture absorption rate and a high flexural strength. In some embodiments, the molding 161 includes various materials, such as molding compound, molding underfill, epoxy, resin, or the like.

In some embodiments, a semiconductor package 102 includes the first die 111, the molding 161 surrounds the first die 111, and the RDL 151 is disposed under the first die 111 and the molding 161. In some embodiments, the semiconductor package 102 further includes the first conductive bump 141 and the underfill 142 between the first die 111 and the RDL 151. In some embodiments, the semiconductor package 102 further includes the bump pad 143 and the conductive bump 144 under the RDL 151. In some embodiments, the semiconductor package 102 is an integrated fan out (InFO) package, wherein I/O terminals of the first die 111 are fanned out and redistributed over a greater area. In some embodiments, the semiconductor package 102 is a three-dimensional integrated circuit (3D IC). In some embodiments, the semiconductor package 102 is a chip on wafer on substrate (CoWoS) structure.

In some embodiments, the support element 121 is disposed over the semiconductor package 102 and configured to provide an adequate mechanical support to the overlying semiconductor package 102, so that the warpage of semiconductor package 102 may be reduced. In some embodiments, the support element 121 attaches to the semiconductor package 102 to form the semiconductor structure 100.

In some embodiments, the support element 121 is disposed over the first die 111 and the molding 161. The support element 121 overlaps the second surface 113 of the first die 111 and a top surface 163 of the molding 161. In some embodiments, the top surface 163 of the molding 161 is at a same level as the second surface 113 of the first die 111. In some embodiments, the top surface 163 of the molding 161 is coplanar with the second surface 113 of the first die 111. In some embodiments, the support element 121 extends laterally beyond the edge 115 of the first die 111 from a top view. In some embodiments, the support element 121 extends laterally beyond an edge 162 of the molding 161 from a top view.

A thickness T1 of the support element 121 provides adequate mechanical support to the semiconductor package 102. In some embodiments, the thickness T1 of the support element 121 is substantially equal to or greater than a thickness T2 of the first die 111. In some embodiments, a ratio of the thickness T2 of the first die 111 to the thickness T1 of the support element 121 is between about 1:1.2 and about 1:10. In some embodiments, the thickness T1 of the support element 121 is greater than 50 μm. In some embodiments, the thickness T1 of the support element 121 is between about 50 μm and about 600 μm. In some embodiments, the thickness T1 of the support element 121 is between about 300 μm and about 600 sm. In some embodiments, a total thickness of the first die 111 and the support element 121 is less than about 1000 μm. In some embodiments, the total thickness of the first die 111 and the support element 121 is between about 600 μm and 700 μm.

In some embodiments, the support element 121 includes a dummy support wafer or a blank wafer with no active devices (such as transistors and diodes) or passive devices (such as resistors, capacitors and inductors) formed therein. In some embodiments, the support element 121 is free from metal lines, vias, etc. formed therein. In some embodiments, the support element 121 includes a rigid material, which may have a Young's modulus equal to or greater than the Young's modulus of silicon (about 165 GPa to about 179 GPa).

In some embodiments, the support element 121 has a good thermal conductivity. In some embodiments, the support element 121 includes silicon (having a thermal conductivity equal to about 148 W/(m*K)). The support element 121 may be a silicon substrate. In some embodiments, the support element 121 includes a metal or a metal alloy, such as copper, aluminum, nickel, stainless steel, or the like. In some embodiments, the support element 121 includes dielectric material or ceramic.

In some embodiments, a length L1 of the support element 121 is substantially greater than a length L2 of the first die 111, and the warpage of the semiconductor package 102 may be reduced. In some embodiments, the length L1 of the support element 121 is equal to or greater than a length L3 of the semiconductor package 102 (equal to a total length of the molding 161 and the first die 111).

The adhesive 131 is configured to join the support element 121 and the semiconductor package 102. In some embodiments, the adhesive 131 is disposed over the molding 161 and the second surface 113 of the first die 111, and the support element 121 is disposed over the adhesive 131. In some embodiments, the adhesive 131 is disposed between the support element 121 and the semiconductor package 102. In some embodiments, the molding 161 is disposed between the adhesive 131 and the dielectric layer 152 of the RDL 151. In some embodiments, the adhesive 131 extends laterally beyond the edge 115 of the first die 111 from a top view. In some embodiments, the adhesive 131 extends laterally beyond the edge 162 of the molding 161 from a top view. In some embodiments, the adhesive 131 overlaps the top surface 163 of the molding 161. In some embodiments, the adhesive 131 is a die-attach film (DAF).

Figure 2:
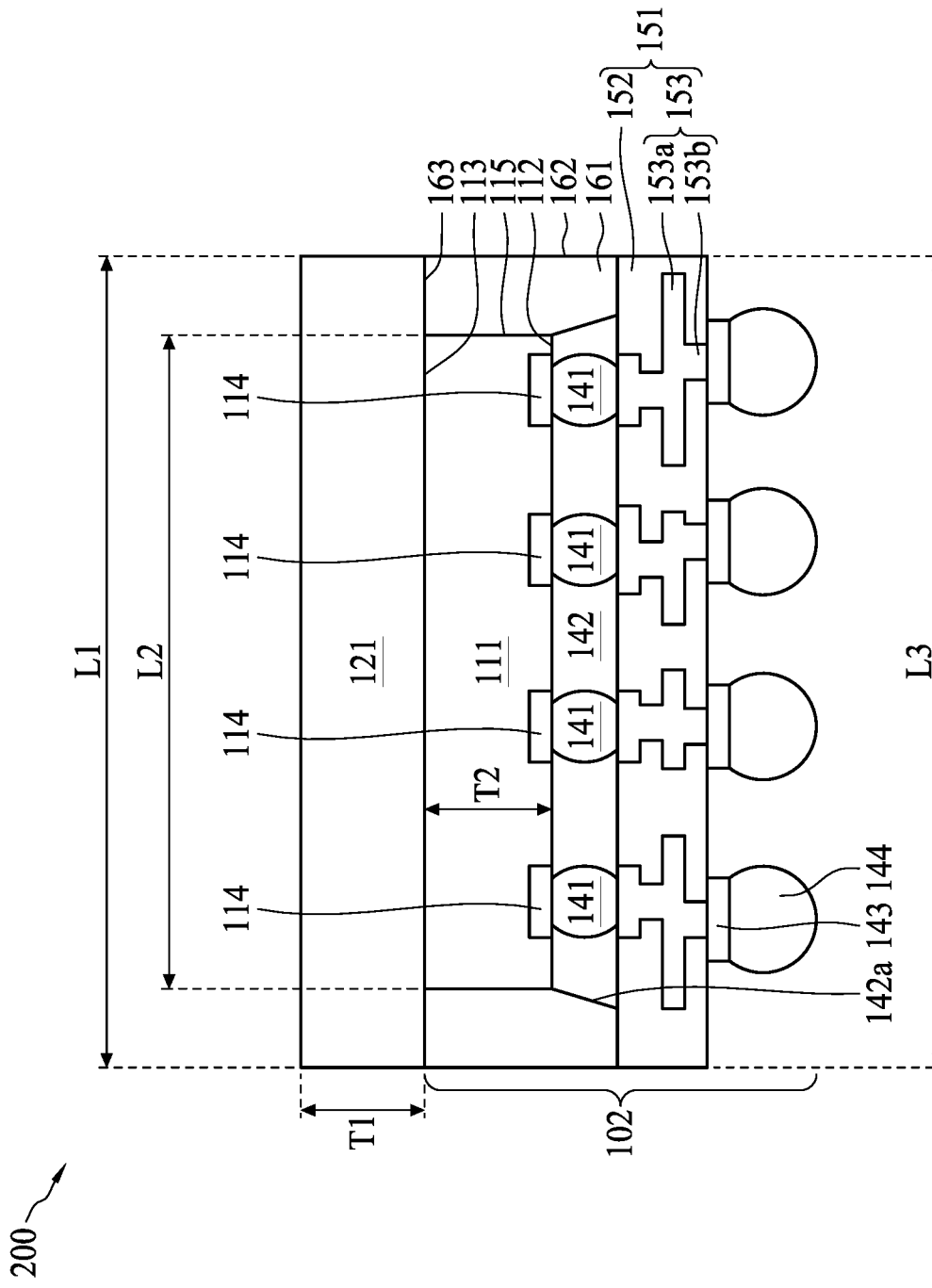
FIG. 2 is a cross-sectional view of a semiconductor structure in accordance with some embodiments of the present disclosure.

FIG. 2 is a cross-sectional view of a semiconductor structure 200 in accordance with some embodiments of the present disclosure. In some embodiments, referring to FIG. 2, the semiconductor structure 200 includes a first die 111, a support element 121, a first conductive bump 141, a redistribution layer 151, and a molding 161. In some embodiments, a semiconductor package 102 is comprised of the first die 111, the first conductive bump 141, the RDL 151 and the molding 161. In some embodiments, an adhesive is omitted.

In some embodiments, the support element 121 is in contact with the semiconductor package 102. In some embodiments, the support element 121 is bonded to the semiconductor package 102 directly. In some embodiments, the support element 121 is in contact with a second surface 113 of the first die 111. In some embodiments, the support element 121 is in contact with a top surface 163 of the molding 161. In some embodiments, both the support element 121 and the semiconductor package 102 include silicon, and a silicon bonding is formed between the support element 121 and the semiconductor package 102.

Figure 3:
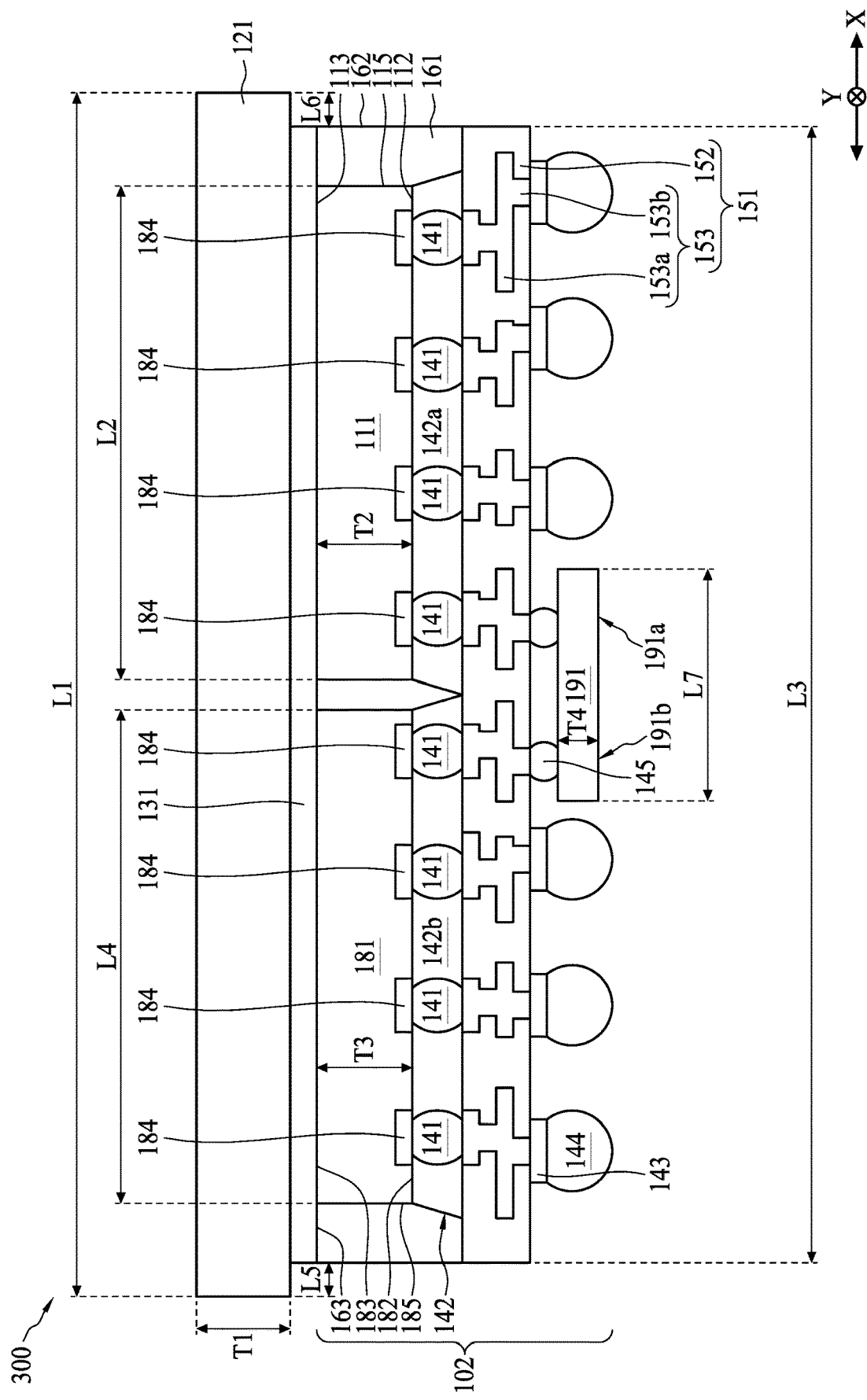
FIG. 3 is a cross-sectional view of a semiconductor structure in accordance with some embodiments of the present disclosure.
Figure 4:
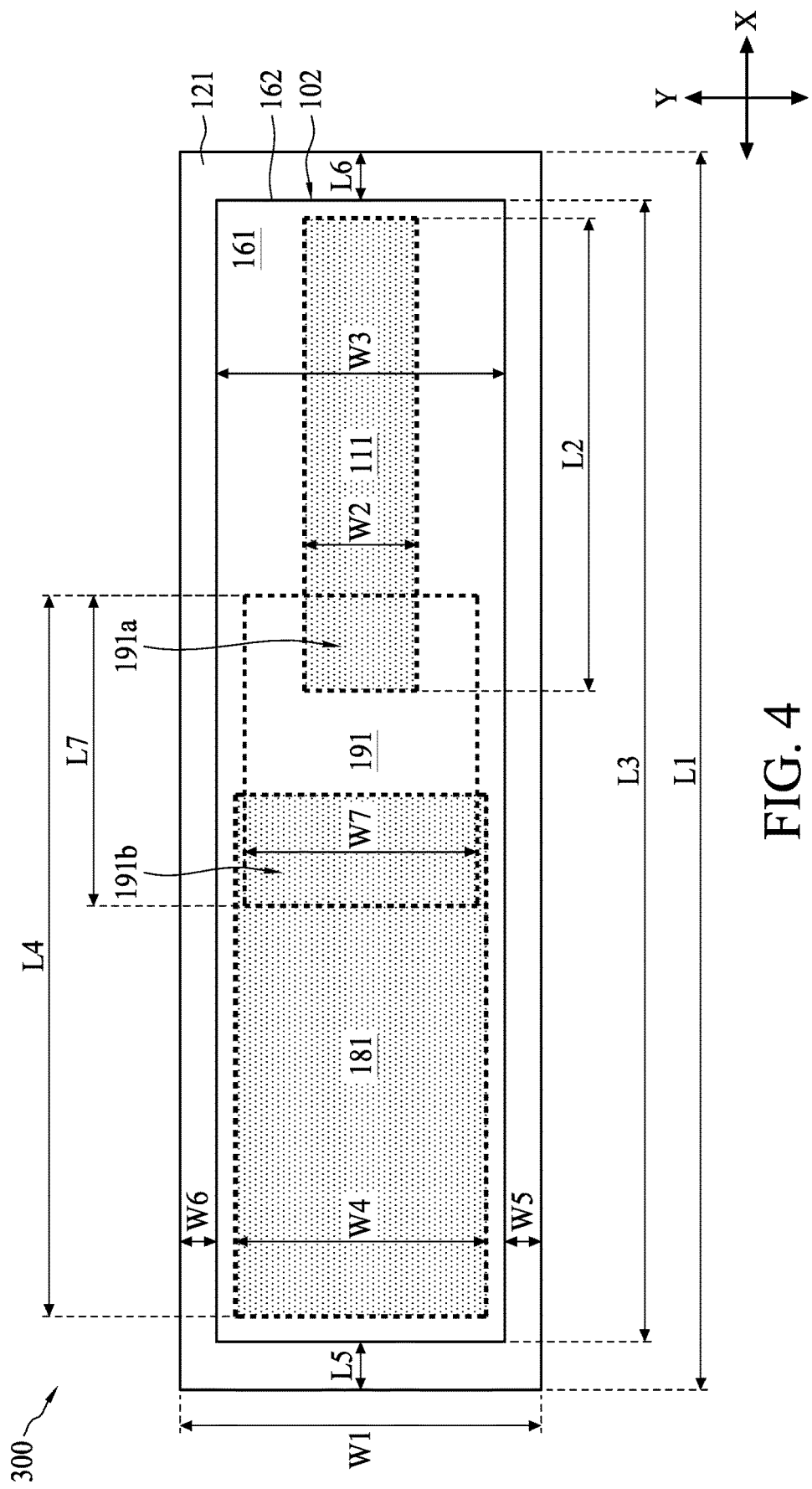
FIG. 4 is a top view of the semiconductor structure in FIG. 3.

FIG. 3 is a cross-sectional view of a semiconductor structure 300 in accordance with some embodiments of the present disclosure. FIG. 4 is a top view of the semiconductor structure 300 in accordance with some embodiments of the present disclosure. In some embodiments, referring to FIG. 3, the semiconductor structure 300 includes a second die 181 adjacent to a first die 111 and surrounded by a molding 161. In some embodiments, a portion of the molding 161 is disposed between the first die 111 and the second die 181. The second die 181 includes a third surface 182 and a fourth surface 183 opposite to the third surface 182. In some embodiments, an adhesive 131 is disposed between a support element 121 and the fourth surface 183 of the second die 181. In some embodiments, the adhesive 131 is omitted. In some embodiments, an RDL 151 is disposed under the first die 111 and the second die 181.

In some embodiments, the third surface 182 is a front side of the second die 181, and the fourth surface 183 is a back side of the second die 181. In some embodiments, the second die 181 includes integrated circuit devices (such as active devices, which include transistors, for example) at the third surfaces 182. In some embodiments, the second die 181 includes a semiconductor substrate and several circuitries thereon. In some embodiments, the second die 181 is a logic die, and may be a central processing unit (CPU) die, a graphic processing unit (GPU) die, a mobile application die, a micro control unit (MCU) die, an input-output (IO) die, a baseband (BB) die, an application processor (AP) die, or the like. A function and configuration of the second die 181 may be similar to or different from a function and configuration of the first die 111.

In some embodiments, the second die 181 includes a plurality of conductive members 184 such as pads. In some embodiments, the conductive members 184 form a circuitry within the second die 181. In some embodiments, the conductive members 184 are electrically connected to the integrated circuit devices. In some embodiments, the conductive members 184 include gold, silver, copper, nickel, tungsten, aluminum, palladium and/or alloys thereof. In some embodiments, the conductive members 184 are exposed through the third surface 182 of the second die 181.

In some embodiments, a first conductive bump 141 is disposed at the third surface 182 of the second die 181. In some embodiments, a plurality of the first conductive bumps 141 are disposed at the third surface 182 of the second die 181 and electrically connected to the conductive members 184 of the second die 181. In some embodiments, the first conductive bumps 141 are disposed between the RDL 151 and the second die 181.

In some embodiments, an underfill 142 is disposed under the second die 181 and between the RDL 151 and the third surface 182 of the second die 181. In some embodiments, a first portion 142a of the underfill 142 is in contact with the first surface 112 of the first die 111, and a second portion 142b of the underfill 142 is in contact with the third surface 182 of the second die 181. In some embodiments, the first portion 142a is in contact with the second portion 142b. In some embodiments, the first portion 142a is separated from the second portion 142b, and a portion of the molding 161 is disposed between the first portion 142a and the second portion 142b.

In some embodiments, an interconnect structure 153 of the RDL 151 is disposed under the third surface 182 of the second die 181 and electrically connected to the second die 181. In some embodiments, a bump pad 143 and a second conductive bump 144 are disposed under the third surface 182 of the second die 181 and electrically connected to the second die 181.

In some embodiments, the fourth surface 183 of the second die 181 is substantially coplanar with the second surface 113 of the first die 111. In some embodiments, the support element 121 is disposed over the second surface 113 of the first die 111 and the fourth surface 183 of the second die 181. In some embodiments, a top surface 163 of the molding 161 is at a same level as the fourth surface 183 of the second die 181. In some embodiments, the support element 121 is disposed over the top surface 163 of the molding 161. In some embodiments, a thickness T2 of the first die 111 is substantially equal to a thickness T3 of the second die 181.

In some embodiments, referring to FIGS. 3 and 4, a length L1 of the support element 121, a length L2 of the first die 111, a length L3 of the semiconductor package 102, and a length L4 of the second die 181 extend along a first direction X. In some embodiments, a width W1 of the support element 121, a width W2 of the first die 111, a width W3 of the semiconductor package 102, and a width W4 of the second die 181 extend along a second direction Y perpendicular to the first direction X. In some embodiments, the length L4 of the second die 181 may be similar to or different from the length L2 of the first die 111. In some embodiments, the width W4 of the second die 181 may be similar to or different from the width W2 of the first die 111.

In some embodiments, both the semiconductor package 102 and the support element 121 have elongated shapes, such as rectangles. In some embodiments, the width W1 of the support element 121 is less than the length L1 of the support element 121, and the width W3 of the semiconductor package 102 is less than the length L3 of the semiconductor package 102. For example, a ratio of the length L3 of the semiconductor package 102 to the width W3 of the semiconductor package 102 is greater than 1.5:1. In some embodiments, the ratio of the length L3 3 to the width W3 is greater than 3:1. A long side of the semiconductor package 102 is more likely to warp than a short side, and at least equal or more support may be needed on the long side compared to the short side.

Increasing the length L1 and the width W1 of the support element 121 to be equal to or greater than the respective length L3 and width W3 of the semiconductor package 102 improves a resistance of the semiconductor package 102 to warpage. In some embodiments, the support element 121 extends laterally beyond edges 115, 185 of the first die 111 and the second die 181 from a top view. In some embodiments, the support element 121 has extension portions extending beyond an edge 162 of the molding 161 in the first and second directions X, Y, and the extension portions have widths W5 and W6 and lengths L5 and L6. Each of the width W5 and width W6 and length L5 and length L6 may be greater than about 0.01 mm, and may be in a range between about 0.01 mm and about 5 mm.

In some embodiments, a third die 191 is disposed under the RDL 151 and electrically connected to the interconnect structure 153. In some embodiments, the third die 191 is electrically connected to the interconnect structure 153 through a third conductive bump 145. In some embodiments, the third conductive bump 145 is disposed between the RDL 151 and the third die 191. In some embodiments, the third conductive bump 145 is adjacent to the second conductive bump 144 and the bump pad 143. In some embodiments, an underfill (not shown) is disposed between the third die 191 and the RDL 151 and surrounds the third conductive bump 145. In some embodiments, the third die 191 is electrically connected to the first die 111 and the second die 181.

In some embodiments, the third die 191 includes a first portion 191a overlapping the first die 111. In some embodiments, the third die 191 includes a second portion 191b overlapping the second die 181. In some embodiments, the third die 191 includes the first portion 191a and the second portion 191b. A size and shape of the first portion 191a may be similar to or different from a size and shape of the second portion 191b.

In some embodiments, a thickness T4 of the third die 191 is less than the thickness of the first die 111 or the thickness T3 of the second die 181. In some embodiments, the thickness T4 of the third die 191 is between 20 μm and 100 μm. In some embodiments, a length L7 of the third die 191 is equal to or less than the length L2 of the first die 111 or the length L3 of the second die 181. In some embodiments, a width W7 of the third die 191 is equal to or less than the width W2 of the first die 111 or the width W3 of the second die 181.

Figure 5:
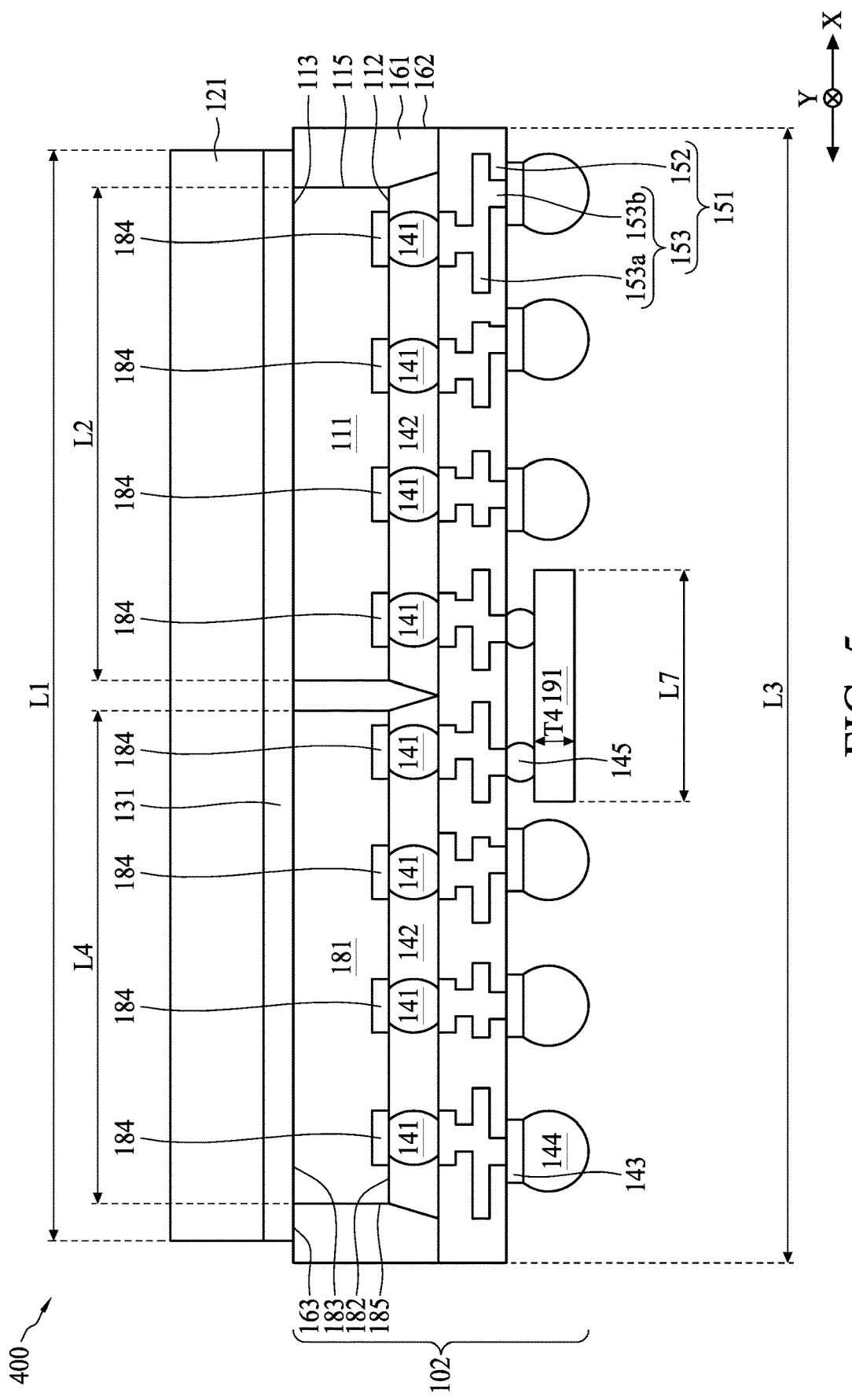
FIG. 5 is a cross-sectional view of a semiconductor structure in accordance with some embodiments of the present disclosure.

FIG. 5 is a cross-sectional view of a semiconductor structure 400 in accordance with some embodiments of the present disclosure. In some embodiments, a support element 121 extends laterally beyond edges 115, 185 of a first die 111 and a second die 181, and a portion of a top surface 163 of a molding 161 is exposed through the support element 121 from a top view. In some embodiments, a length L1 of the support element 121 is less than a length L3 of a semiconductor package 102. In some embodiments, an adhesive 131 extends laterally beyond the edges 115, 185 of the first die 111 and the second die 181, and a portion of the top surface 163 of the molding 161 is exposed through the adhesive 131 from a top view.

Figure 6:
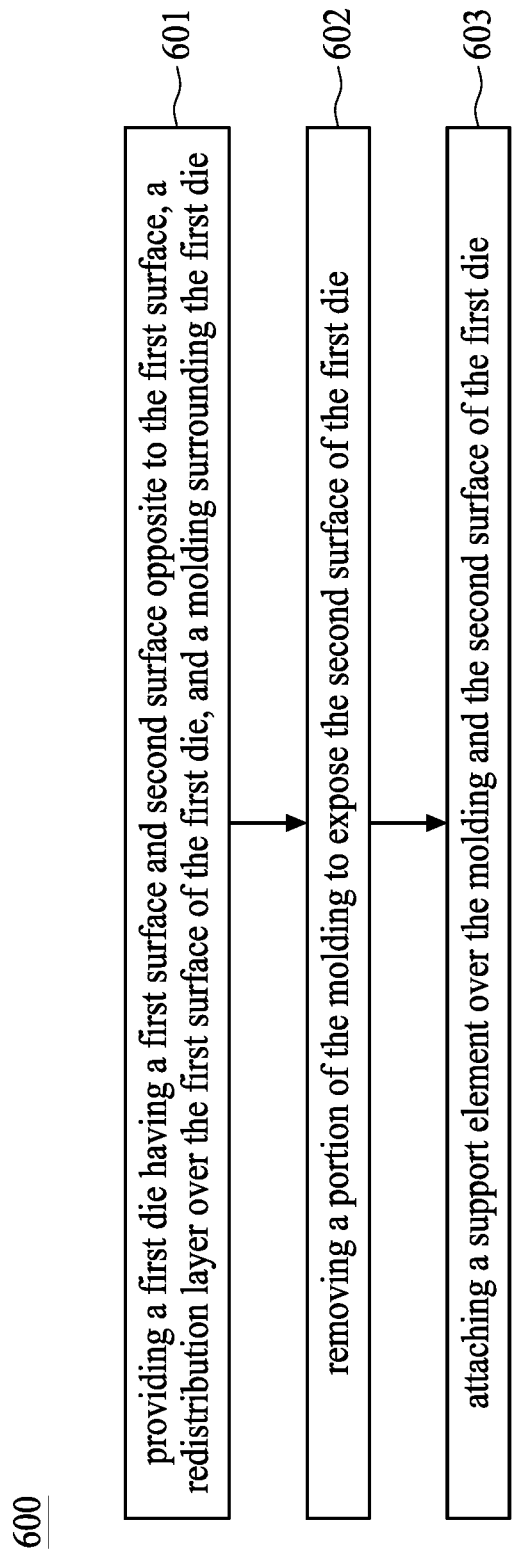
FIG. 6 is a flow diagram of a method of manufacturing a semiconductor structure in accordance with some embodiments of the present disclosure.

FIG. 6 is a flowchart of a method 600 for manufacturing a semiconductor structure in accordance with some embodiments of the present disclosure. As illustrated in FIG. 6, the method 600 includes several operations: (601) providing a first die having a first surface and a second surface opposite to the first surface, a redistribution layer over the first surface of the first die, and a molding surrounding the first die; (602) removing a portion of the molding to expose the second surface of the first die; and (603) attaching a support element over the molding and the second surface of the first die.

FIGS. 7 to 12 are schematic cross-sectional views of a semiconductor structure during various stages of manufacturing in accordance with some embodiments of the present disclosure. In some embodiments, the method 600 is usable to form the semiconductor structures 100 and 200 as illustrated in FIGS. 1 and 2.

Figure 7:
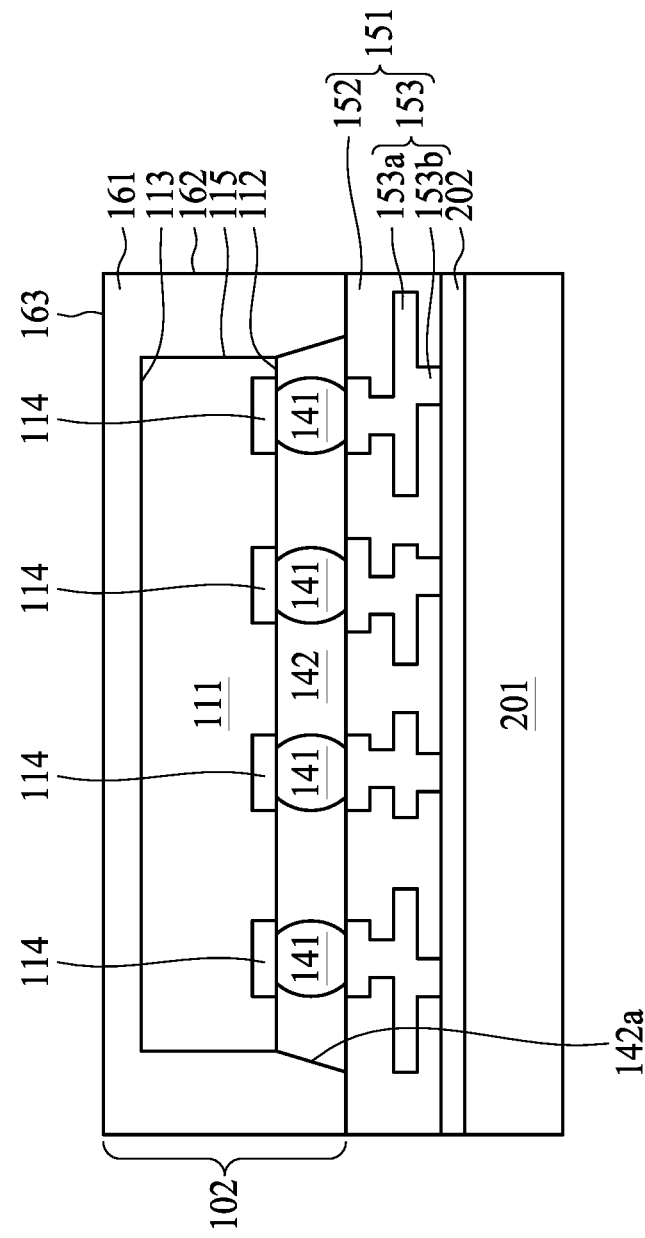
FIGS. 7 to 12 are cross-sectional views of a semiconductor structure during various stages of manufacturing in accordance with some embodiments of the present disclosure.

As illustrated in FIG. 7, in operation 601, a first die 111 having a first surface 112 and a second surface 113 opposite to the first surface 112, a redistribution layer (RDL) 151 over the first surface 112 of the first die 111, and a molding 161 surrounding the first die 111 are provided. In some embodiments, the molding 161 covers the second surface 113 of the first die 111. The first die 111 is encapsulated in the molding 161 and electrically connected to an interconnect structure 153 of the RDL 151. In some embodiments, the interconnect structure 153 is surrounded by a dielectric layer 152 of the RDL 151. A top surface 163 of the molding 161 may be higher than the second surface 113 of the first die 111 when the first die 111 is encapsulated. In some embodiments, a first conductive bump 141 between the first surface 112 of the first die 111 and the RDL 151 and an underfill 142 surrounding the first conductive bump 141 are provided. In some embodiments, a semiconductor package 102 including the first die 111, the RDL 151, and the molding 161 is provided.

In some embodiments, a carrier 201 is provided, and a release film 202 is coated on the carrier 201. The carrier 201 may include a transparent material, and may be a glass carrier, a ceramic carrier, an organic carrier, or the like. The release film 202 is over the carrier 201. The release film 202 may include a light-to-heat-conversion (LTHC) coating material. The release film 202 may be applied onto the carrier 201 through coating. In some embodiments, the LTHC coating is capable of being decomposed under the heat of light/radiation (such as laser), and the carrier 201 may be released from the semiconductor package 102 formed thereon. In some embodiments, the release film 202 includes carbon black (carbon particles), a solvent, a silicon filler, and/or an epoxy. The epoxy may include polyimide or another polymer such as acrylic.

Figure 8:
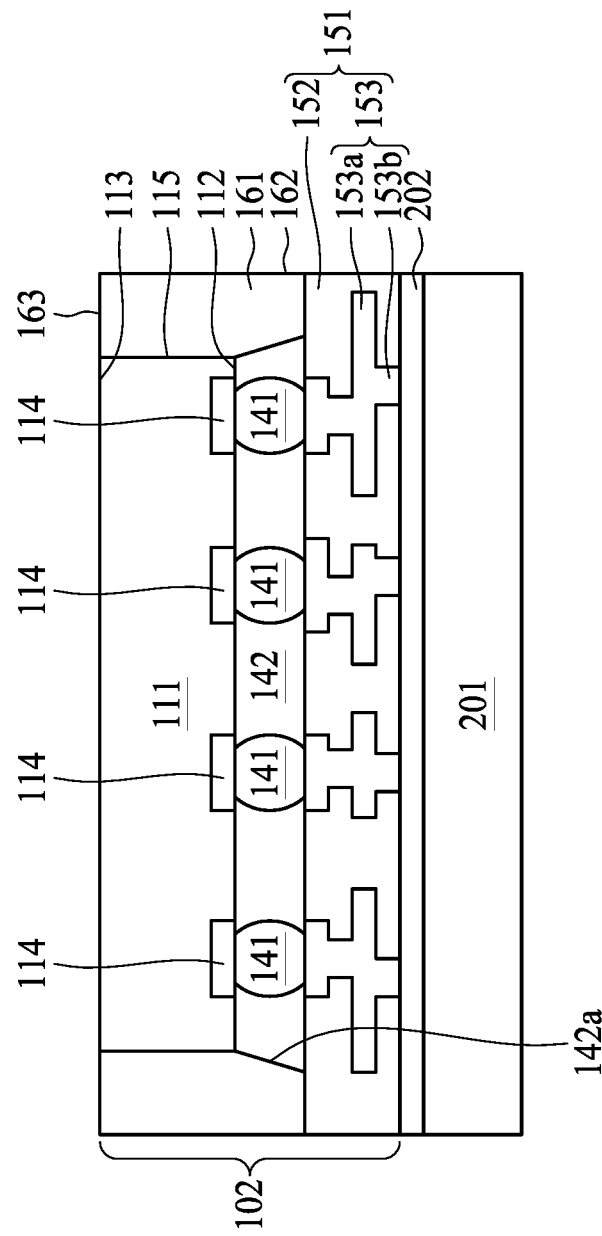

As illustrated in FIG. 8, in operation 602, a portion of the molding 161 is removed to expose the second surface 113 of the first die 111. In some embodiments, a planarization process such as a chemical mechanical polish (CMP) process or a mechanical grinding process is performed to thin the molding 161 and expose the first die 111. After the removing of the portion of the molding 161, the top surface 163 of the molding 161 is coplanar with the second surface 113 of the first die 111.

Figure 9:
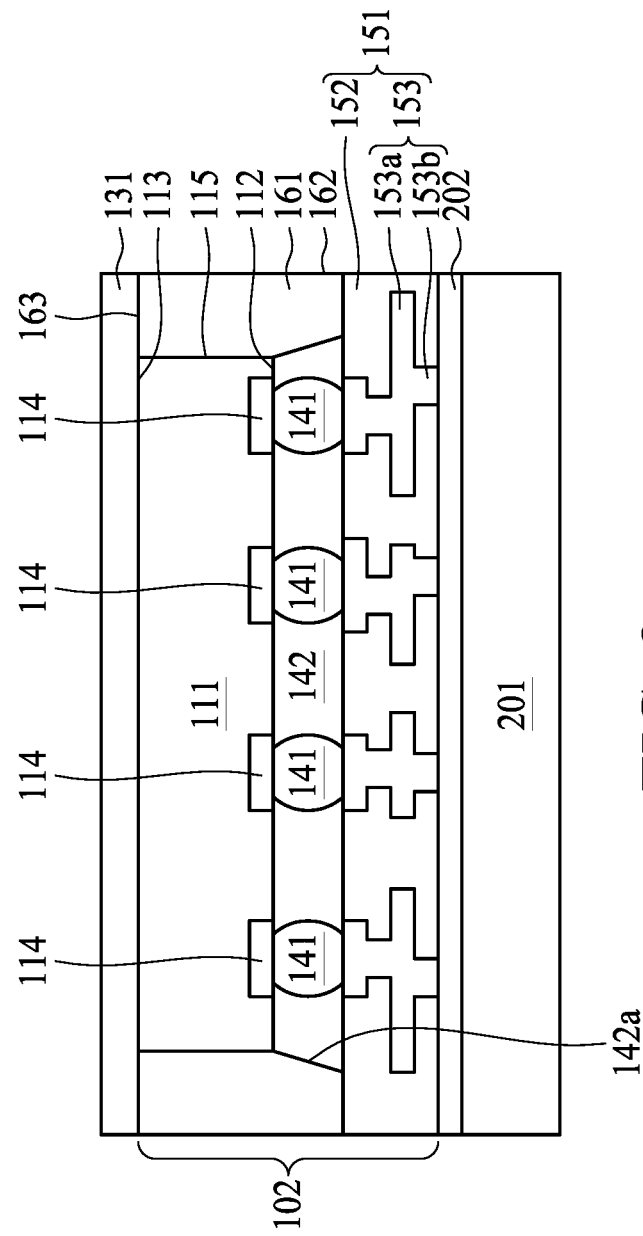

In some embodiments, as illustrated in FIG. 9, an adhesive 131 is disposed over the molding 161 and the first die 111. In some embodiments, the adhesive 131 is formed by suitable fabrication techniques such as spin coating.

Figure 10:
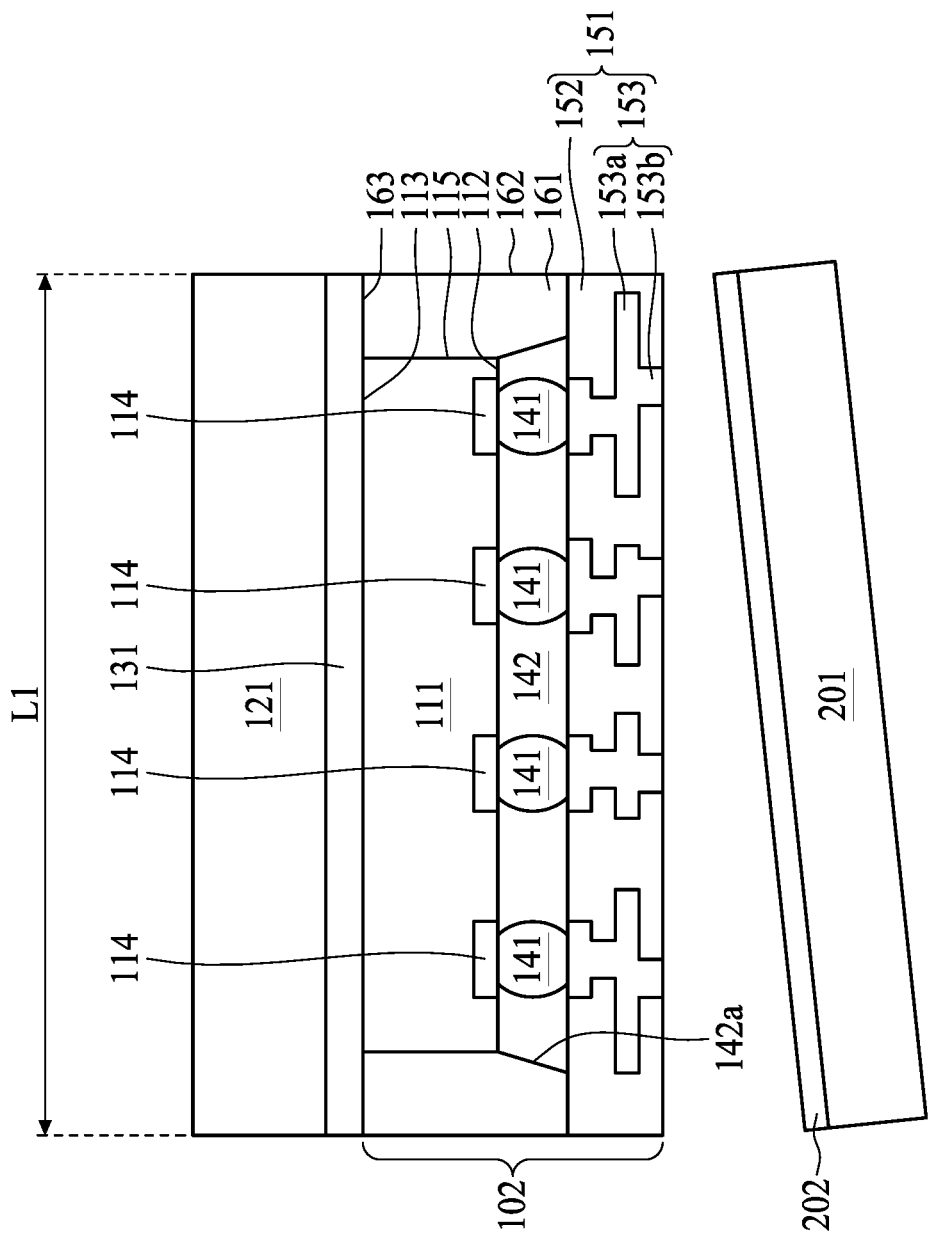

As illustrated in FIG. 10, in operation 603, a support element 121 is attached over the molding 161 and the second surface 113 of the first die 111. In some embodiments, the support element 121 is attached over the molding 161 and the first die 111 using the adhesive 131. In some embodiments, the adhesive 131 is omitted. In some embodiments, the carrier 201 is released from the semiconductor package 102 after the disposing of the support element 121. In some embodiments, a semiconductor structure 100 including the semiconductor package 102 and the support element 121 is formed.

In some embodiments, a length L1 of the support element 121 extends laterally beyond an edge 115 of the first die 111 from a top view. In some embodiments, the length L1 of the support element 121 is substantially equal to a length of the molding 161 from a top view. In some embodiments, the support element 121 extends laterally beyond the edge 162 of the molding 161 from a top view.

Figure 11:
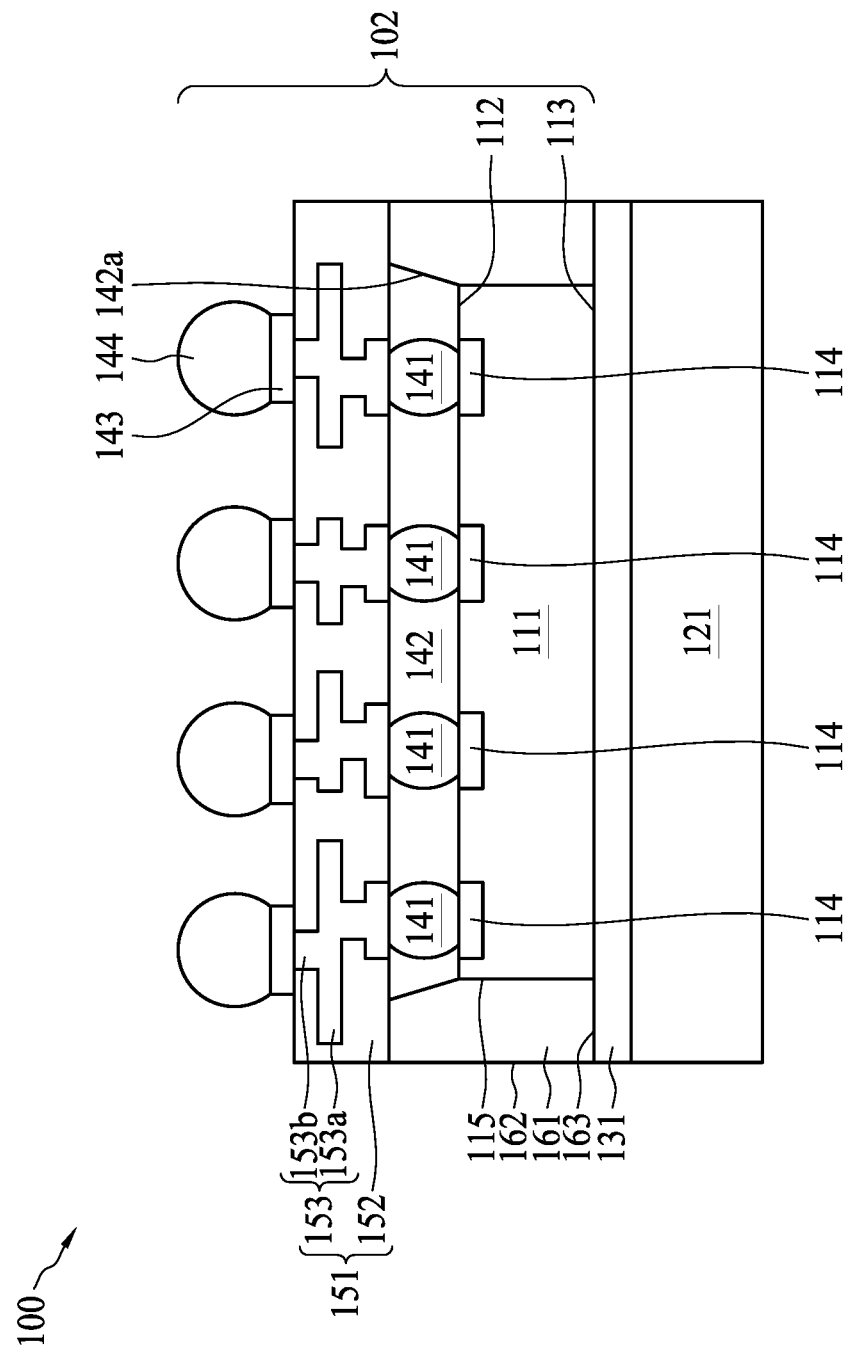

In some embodiments, as illustrated in FIG. 11, the semiconductor package 102 is formed. In some embodiments, the method 600 further includes flipping the semiconductor structure 100 to continue formation of the semiconductor package 102. In some embodiments, the method 600 further includes forming a bump pad 143 disposed on the RDL 151 and electrically connected to the first die 111 through the interconnect structure 153 of the RDL 151. In some embodiments, the method 600 further includes disposing a second conductive bump 144 over the bump pad 143. In some embodiments, the semiconductor structure 100 is formed.

Figure 12:
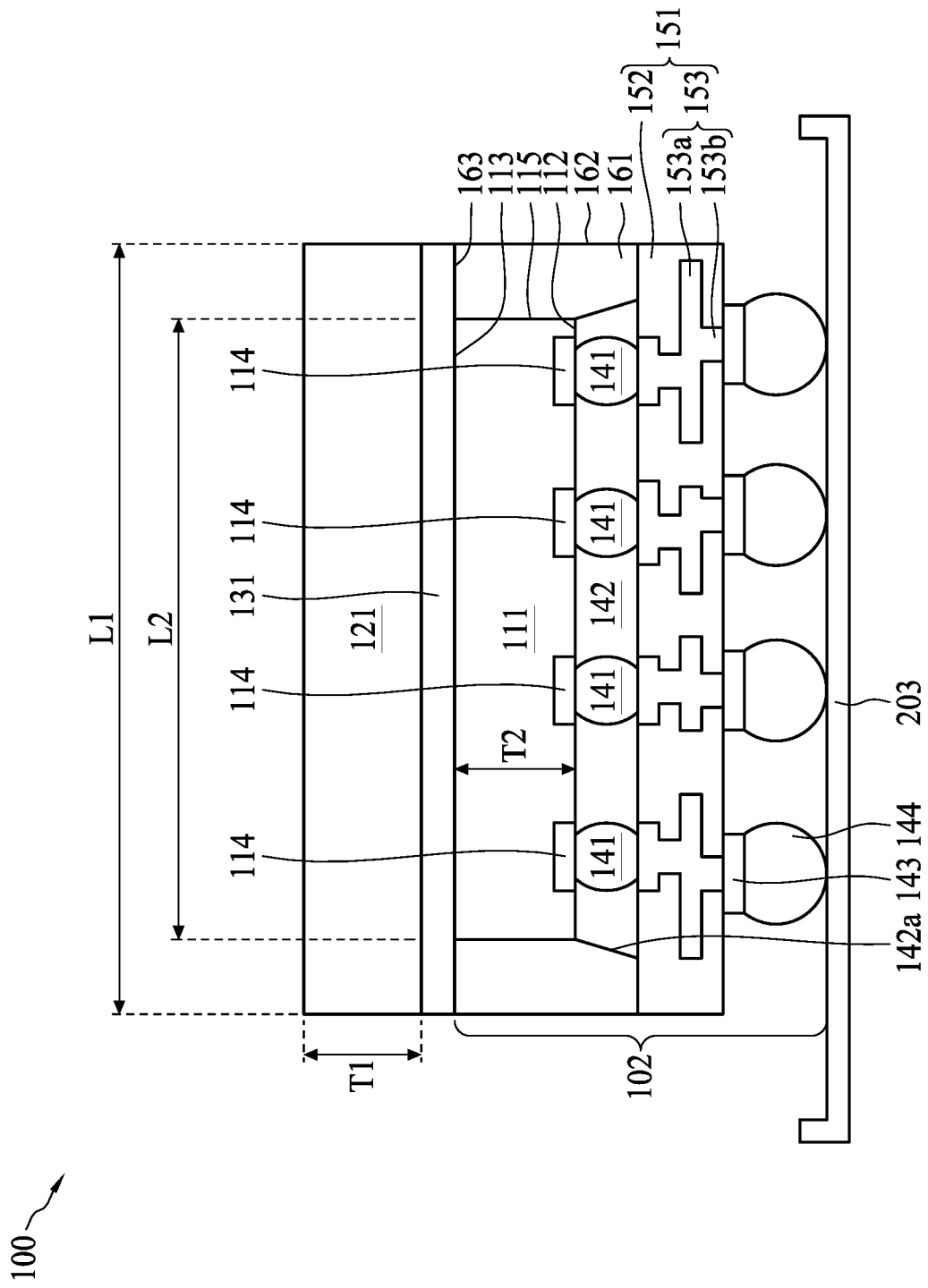

In some embodiments, as illustrated in FIG. 12, the method 600 further includes flipping the semiconductor structure 100 to dispose the semiconductor structure 100 over a tape 203. In some embodiments, the second conductive bump 144 attaches to the tape 203. In some embodiments, the method 600 further includes performing a singulation by cutting the support element 121, the molding 161 and the RDL 151.

Figure 13:
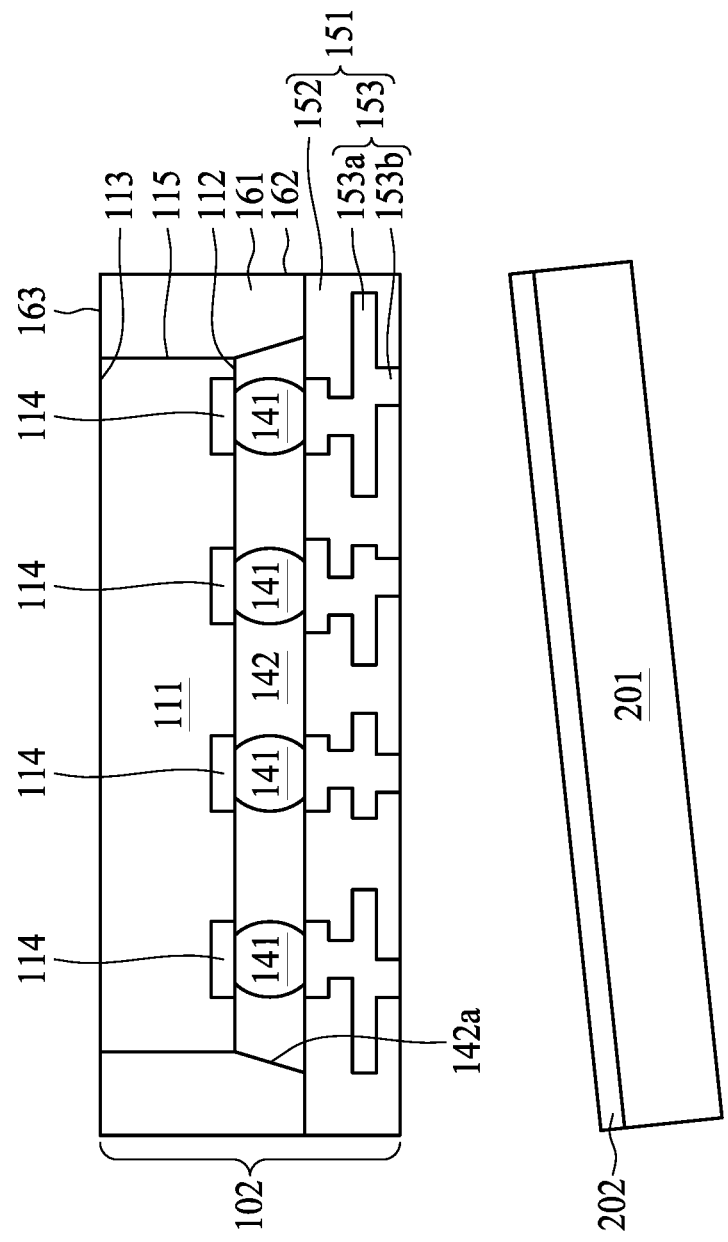
FIGS. 13 to 16 are cross-sectional views of a semiconductor structure during various stages of manufacturing in accordance with some embodiments of the present disclosure.

FIGS. 13 to 17 are schematic cross-sectional views of a semiconductor structure during various stages of manufacturing in accordance with some embodiments of the present disclosure. In some embodiments, as illustrated in FIG. 13, after performing the operation 601 and before performing the operation 602, the semiconductor package 102 is disposed on a carrier. In some embodiments, a portion of the molding 161 is removed to expose the first die 111, and then the carrier 201 is released from the molding 161. In some embodiments, the top surface 163 of the molding 161 is coplanar with the second surface 113 of the first die 111 after the removal of the portion of the molding 161.

Figure 14:
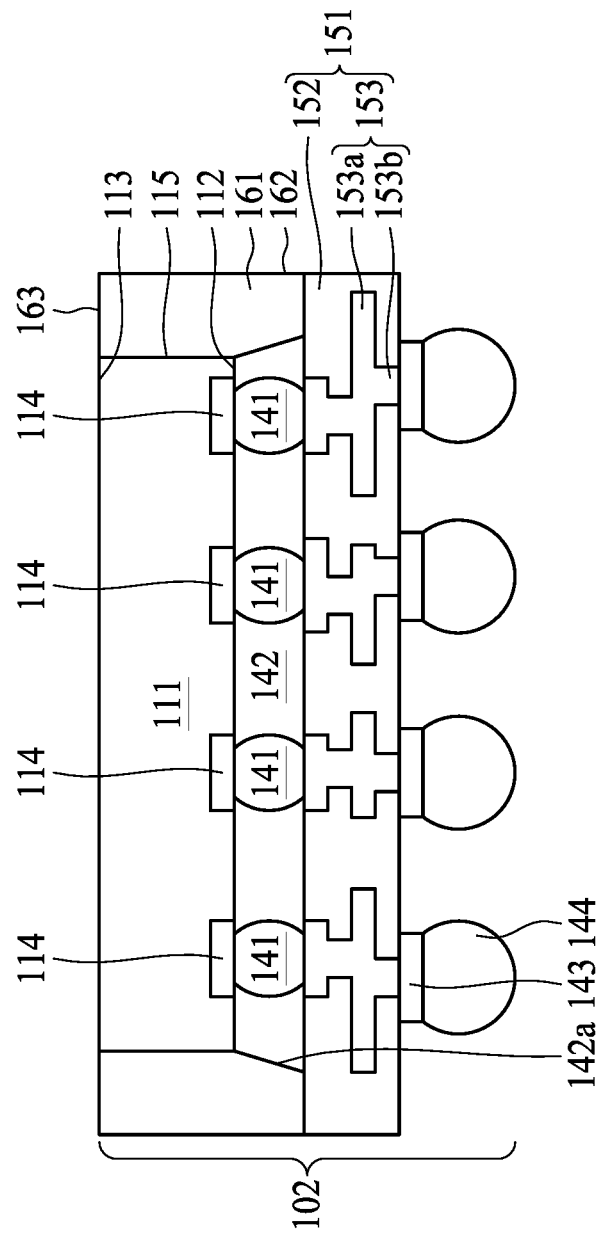

In some embodiments, as illustrated in FIG. 14, after the carrier 201 is released, the bump pad 143 is disposed under the RDL 151 and electrically connected to the interconnect structure 153 of the RDL 151, and the second conductive bump 144 is disposed under the bump pad 143.

Figure 15:
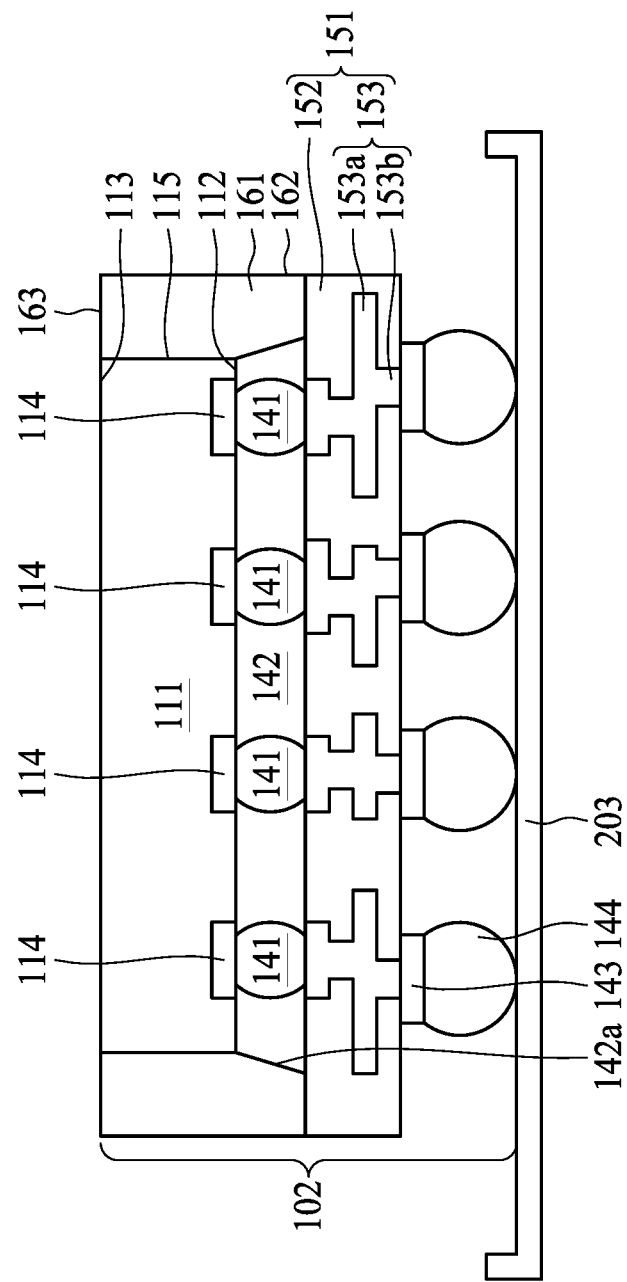

In some embodiments, as illustrated in FIG. 15, the method 600 further includes disposing the semiconductor package 102 over a tape 203. In some embodiments, the second conductive bump 144 attaches to the tape 203. In some embodiments, the method 600 further includes performing a singulation by cutting the molding 161 and the RDL 151. In some embodiments, the method 600 further includes removing the tape 203.

Figure 16:
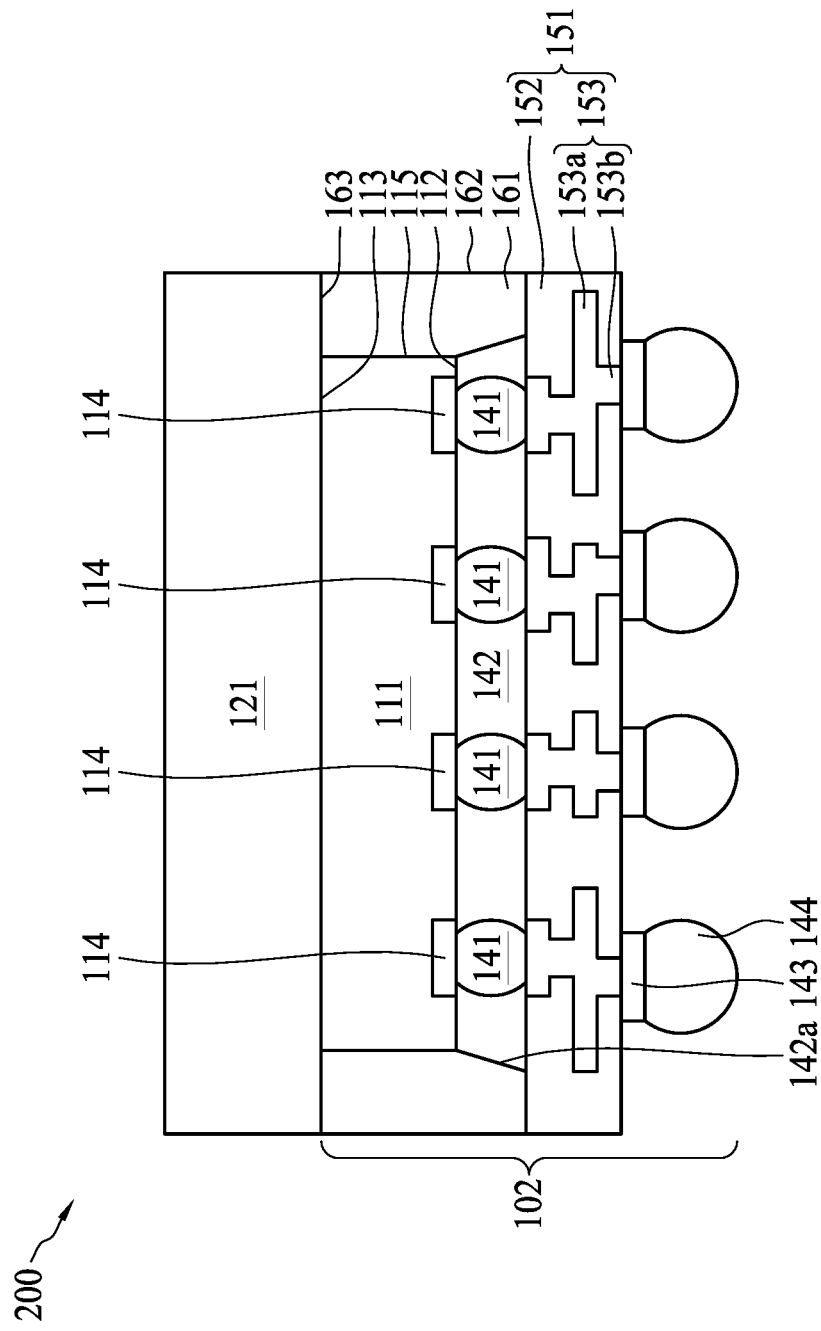

In some embodiments, as illustrated in FIG. 16, the operation 603 is performed to attach the support element 121 over the top surface 163 of the molding 161 and the second surface 113 of the first die 111. In some embodiments, the method 600 further includes performing a singulation by cutting the molding 161 and the RDL 151, while the operation 603 is performed after the singulation. In some embodiments, when the adhesive 131 is omitted, the support element 121 is directly attached over the molding 161 and the first die 111 by fusion bonding or the like. Accordingly, in some embodiments, the semiconductor structure 200 is completely formed.

FIGS. 17 to 21 are schematic cross-sectional views of a semiconductor structure during various stages of manufacturing in accordance with some embodiments of the present disclosure. In some embodiments, the method 600 is usable to form the semiconductor structures 300 and 400 as illustrated in FIGS. 3 to 5.

Figure 17:
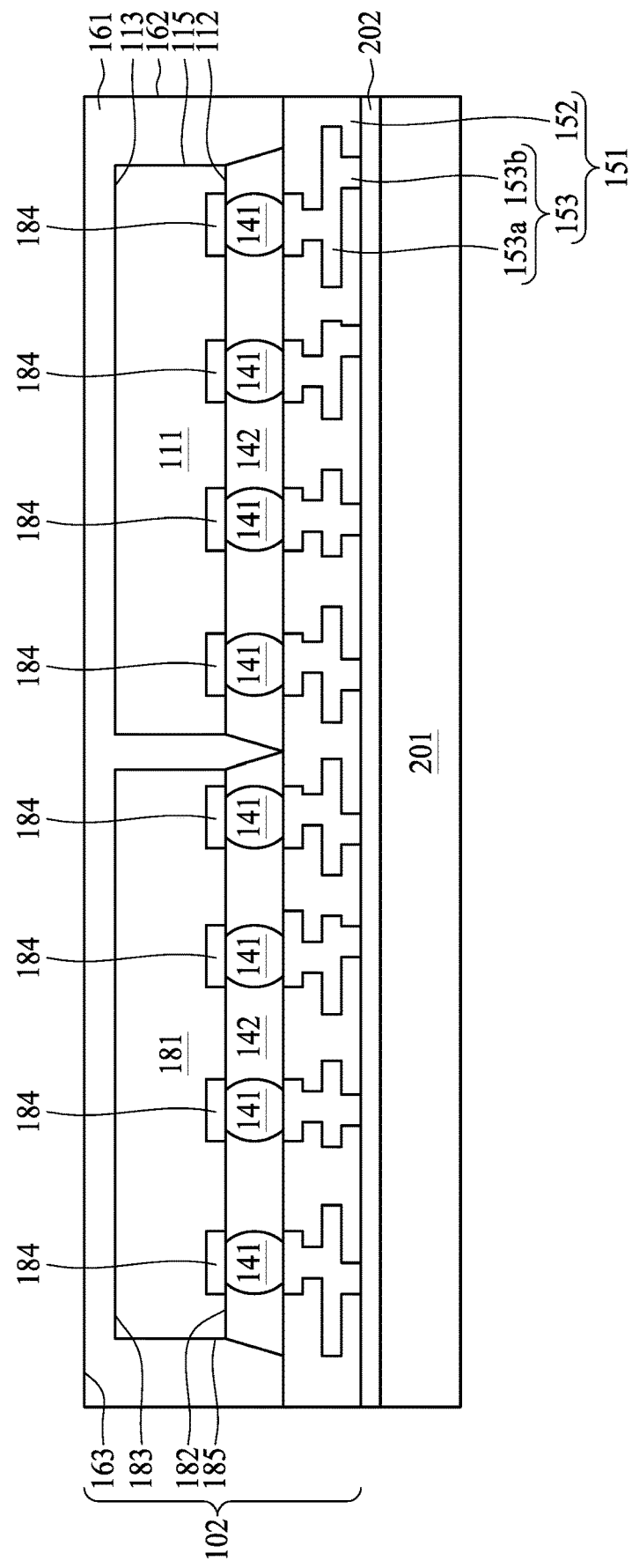
FIGS. 17 to 21 are cross-sectional views of a semiconductor structure during various stages of manufacturing in accordance with some embodiments of the present disclosure.

In some embodiments, as illustrated in FIG. 17, the method 600 further includes disposing a second die 181 adjacent to the first die 111 and surrounded by the molding 161. The second die 181 has a third surface 182 and a fourth surface 183 opposite to the third surface 182. In some embodiments, the first die 111 and the second die 181 are disposed on the RDL 151 and the carrier 201. In some embodiments, the first conductive bump 141 and the underfill 142 are disposed between the second die 181 and the RDL 151. In some embodiments, a semiconductor package 102 including the first die 111 and the second die 181 is provided.

Figure 18:
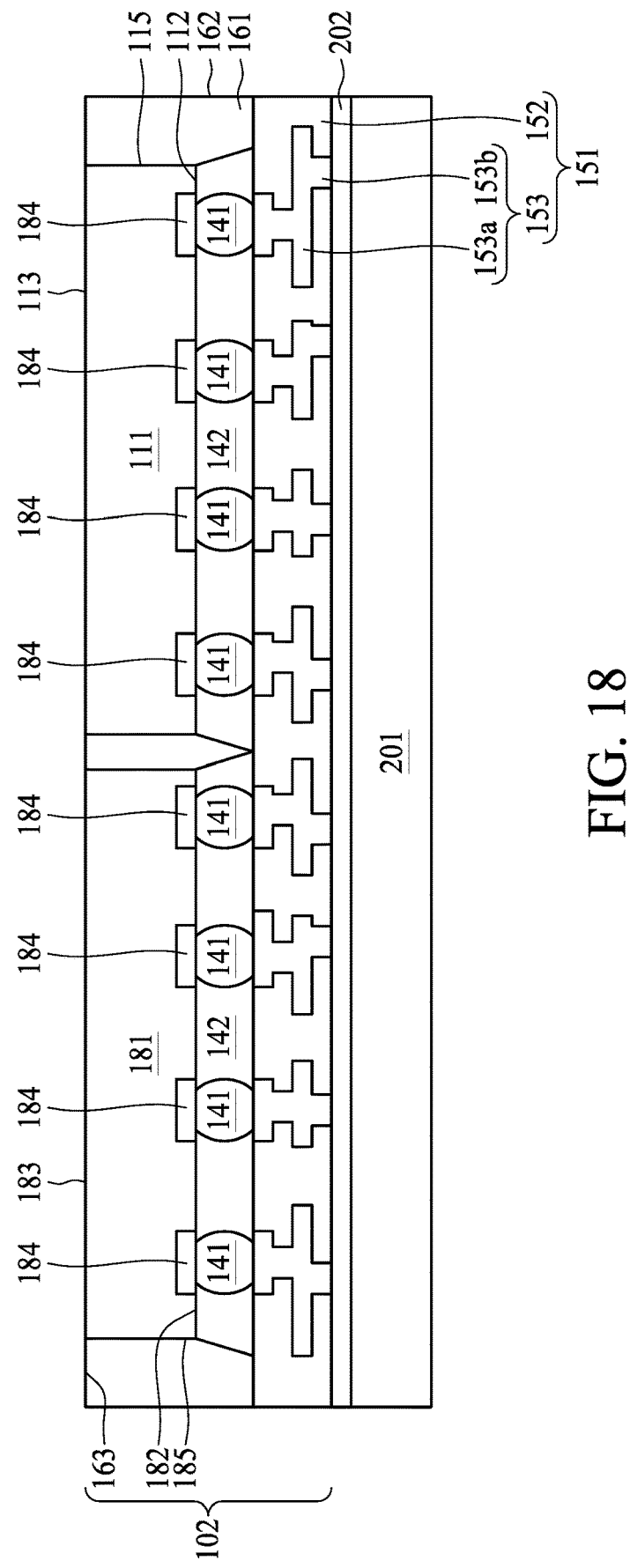

In some embodiments, as illustrated in FIG. 18, in operation 602, a portion of the molding 161 is removed until the top surface 163 of the molding 161 is coplanar with the second surface 113 of the first die 111 and the fourth surface 183 of the second die 181.

Figure 19:
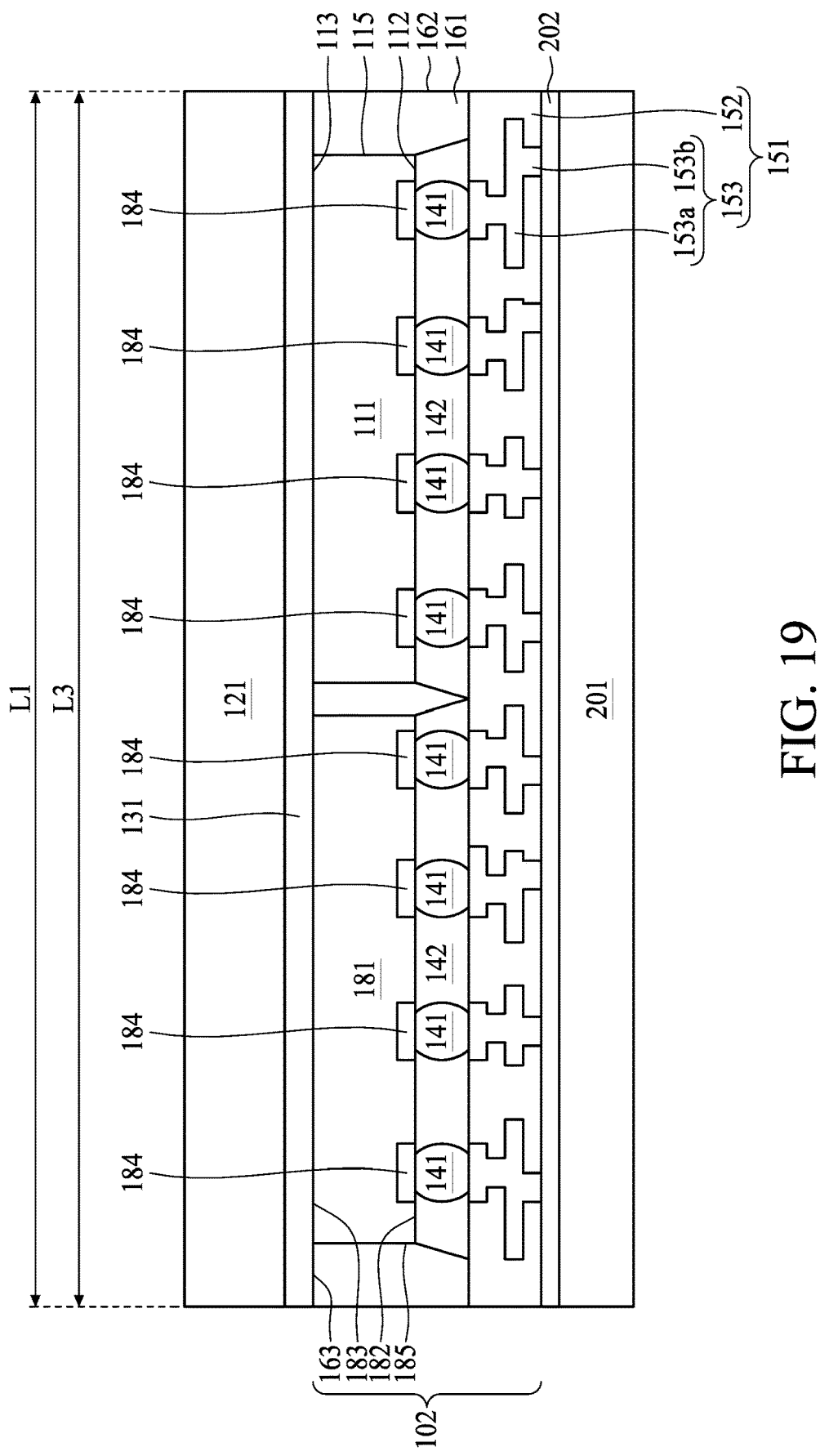

In some embodiments, as illustrated in FIG. 19, a support element 121 is attached over the molding 161, the second surface 113 of the first die 111, and the fourth surface 183 of the second die 181. In some embodiments, the support element 121 is disposed over the semiconductor package 102 including the first die 111 and the second die 181. In some embodiments, the support element 121 is attached over the molding 161, the first die 111 and the second die 181 using an adhesive 131. In some embodiments, the adhesive 131 is disposed over the first die 111 and the second die 181. In some embodiments, the adhesive 131 attaches to the top surface 163 of the molding 161, the second surface 113 of the first die 111 and the fourth surface 183 of the second die 181. In some embodiments, the adhesive 131 is omitted.

In some embodiments, ends of the support element 121 extend laterally beyond the edge 115 of the first die 111 and an edge 185 of the second die 181 from a top view. In some embodiments, a length L1 of the support element 121 is substantially equal to a length L3 of the semiconductor package 102. In some embodiments, the support element 121 extends laterally beyond the edges 162 of the molding 161 from a top view.

Figure 20:
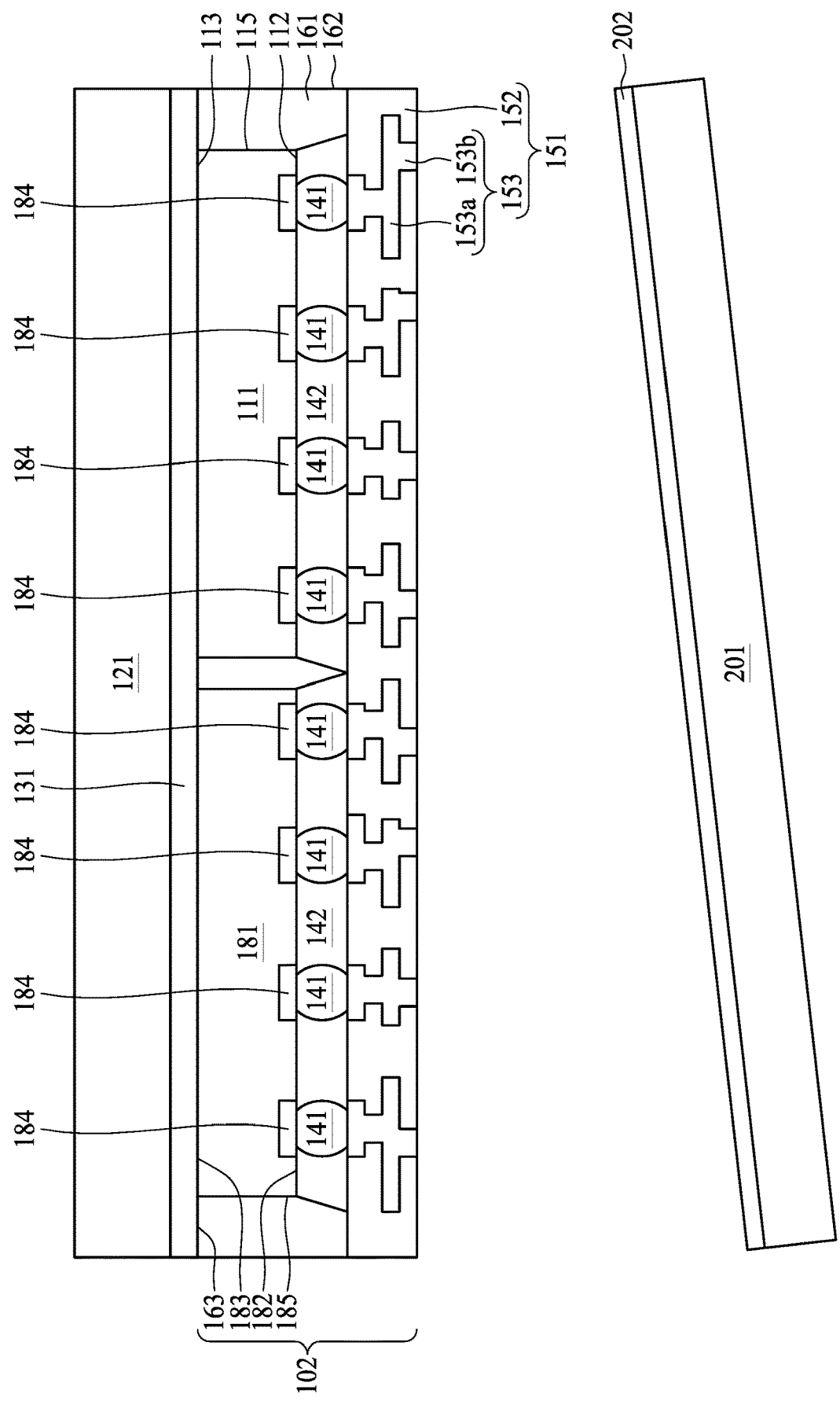
Figure 21:
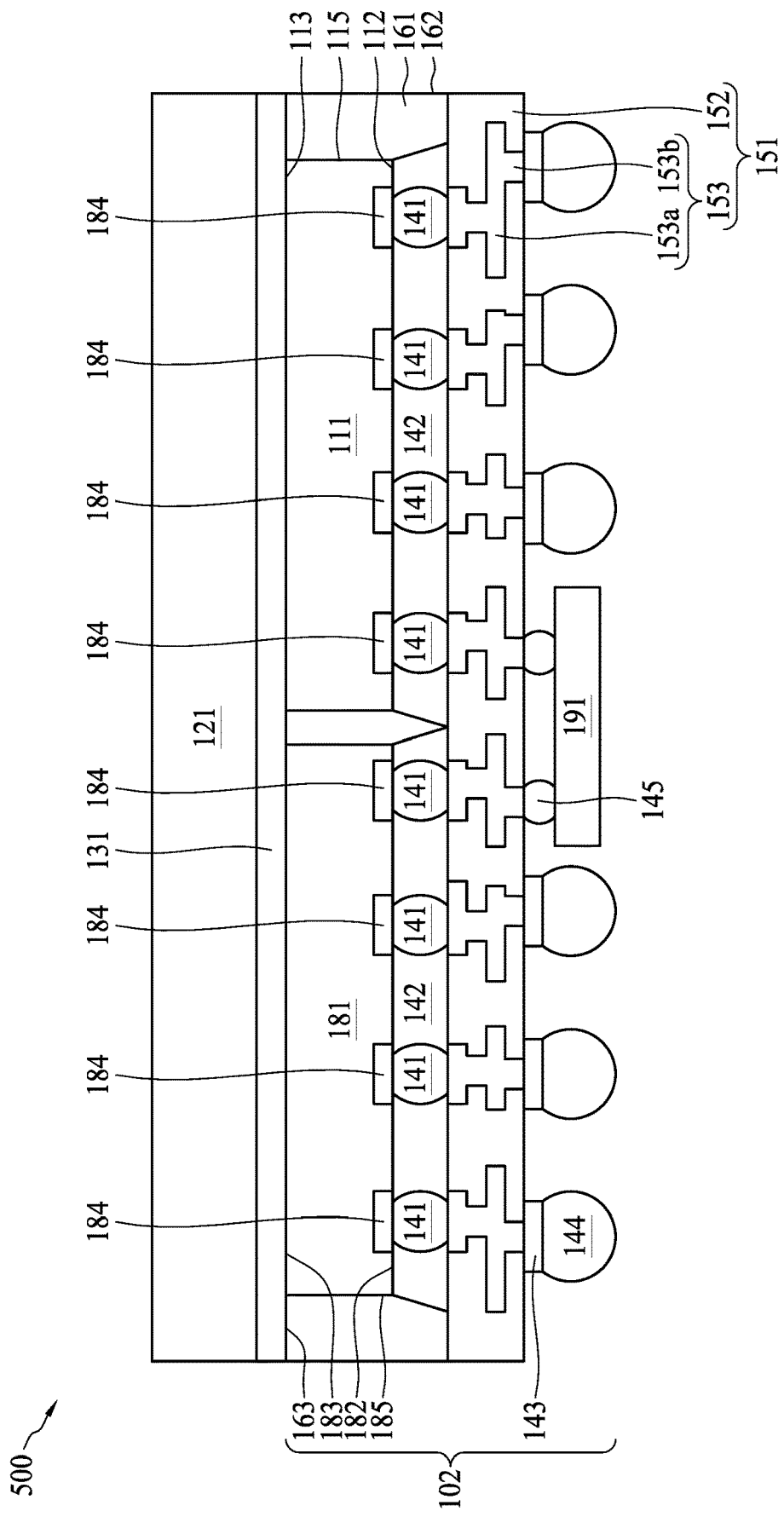

In some embodiments, as illustrated in FIG. 20, the carrier 201 is released from the semiconductor package 102. In some embodiments, as illustrated in FIG. 21, a third die 191 is disposed under the RDL 151 and electrically connected to the first die 111 and the second die 181 through the interconnect structure 153 of the RDL 151. In some embodiments, the third die 191 is disposed under the RDL 151 and is overlapped by the first die 111 and the second die 181. In some embodiments, a plurality of second conductive bumps 144 surround the third die 191. In some embodiments, a semiconductor structure 500 is thereby formed.

An aspect of this disclosure relates to a semiconductor structure. The semiconductor structure includes a first die having a first surface and a second surface opposite to the first surface, a conductive bump disposed at the first surface of the first die, and a redistribution layer (RDL) under the conductive bump. The RDL includes an interconnect structure and a dielectric layer surrounding the interconnect structure, wherein the interconnect structure is electrically connected to the first die through the conductive bump. The semiconductor structure includes a molding over the RDL and surrounding the first die and the conductive bump, an adhesive over the molding and the second surface of the first die, and a support element over the adhesive.

In some embodiments, the support element extends laterally beyond an edge of the first die from a top view. In some embodiments, the support element extends laterally beyond an edge of the molding from a top view. In some embodiments, In some embodiments, the adhesive extend laterally beyond an edge of the first die from a top view. In some embodiments, a thickness of the support element is substantially greater than a thickness of the first die. In some embodiments, a ratio of a thickness of the first die to a thickness of the support element is between about 1:1.2 and about 1:10. In some embodiments, the molding is disposed between the adhesive and the dielectric layer of the RDL. In some embodiments, the semiconductor structure further includes a underfill between the RDL and the first surface of the first die, wherein the underfill surrounds the conductive bump.

In some embodiments, the semiconductor structure further includes a second die adjacent to the first die and surrounded by the molding, wherein the second die includes a third surface and a fourth surface opposite to the third surface. The support element is disposed over the second surface of the first die and the fourth surface of the second die, and the adhesive is disposed between the support element and the fourth surface of the second die. In some embodiments, the support element extends laterally beyond edges of the first die and the second die from a top view. In some embodiments, a thickness of the first die is substantially equal to a thickness of the second die.

An aspect of this description relates to a semiconductor structure. The semiconductor structure includes a first die having a first surface and a second surface opposite to the first surface, a redistribution layer (RDL) under the first surface of the first die and including an interconnect structure electrically connected to the first die, a molding over the RDL and surrounding the first die, and a support element over the molding and the second surface of the first die.

In some embodiments, the support element is in contact with the second surface of the first die. In some embodiments, the support element is a dummy wafer or a silicon substrate. In some embodiments, the semiconductor structure further includes a second die adjacent to the first die and surrounded by the molding, and having a third surface and a fourth surface opposite to the third surface. The support element is disposed over the second surface of the first die and the fourth surface of the second die, and the interconnect structure is disposed under the third surface of the second die and electrically connected to the second die. In some embodiments, the semiconductor structure further includes a third die disposed under the RDL and electrically connected to the interconnect structure, wherein a first portion of the third die overlaps a portion of the first die from a top view, and a second portion of the third die overlaps a portion of the second die from a top view.

An aspect of this description relates to a method of manufacturing a semiconductor structure. The method includes providing a first die having a first surface and a second surface opposite to the first surface, a redistribution layer over the first surface of the first die, and a molding surrounding the first die; removing a portion of the molding to expose the second surface of the first die; and attaching a support element over the molding and the second surface of the first die.

In some embodiments, the redistribution layer includes a dielectric layer and an interconnect structure within the dielectric layer, wherein the interconnect structure is electrically connected to the first die. In some embodiments, the method further includes performing a singulation by cutting the support element, the molding and the dielectric layer. In some embodiments, the second surface of the first die is coplanar with a surface of the molding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first die having a first surface and a second surface opposite to the first surface;
   a second die adjacent to the first die, wherein the second die includes a third surface and a fourth surface opposite to the third surface;
   a first conductive bump disposed at the first surface of the first die and surrounded by a first underfill disposed under the first die;
   a second conductive bump disposed at the third surface of the second die and surrounded by a second underfill disposed under the second die;
   a redistribution layer (RDL) under the first conductive bump and the second conductive bump, and including an interconnect structure and a dielectric layer surrounding the interconnect structure, wherein the interconnect structure is electrically connected to the first die through the first conductive bump and the second die through the second conductive bump;
   a molding over the RDL and surrounding the first die, the second die, the first conductive bump, the second conductive bump, the first underfill and the second underfill;
   an adhesive over the molding, the second surface of the first die and the fourth surface of the second die; and
   a support element over the adhesive,
   wherein the molding is in contact with the first die, the second die, the first underfill and the second underfill,
   a width of the molding is substantially greater than a width of the adhesive,
   the width of the molding is substantially greater than a width of the support element, and
   a portion of the molding is disposed between the first die and the second die and between the first conductive bump and the second conductive bump.

2. The semiconductor structure of claim 1, wherein the support element extends laterally beyond an edge of the first die from a top view.

3. The semiconductor structure of claim 1, wherein the width of the adhesive is substantially equal to the width of the support element.

4. The semiconductor structure of claim 1, wherein a width of the RDL is substantially equal to the width of the support element.

5. The semiconductor structure of claim 1, wherein a thickness of the support element is substantially greater than a thickness of the first die.

6. The semiconductor structure of claim 1, wherein a ratio of a thickness of the first die to a thickness of the support element is between about 1:1.2 and about 1:10.

7. The semiconductor structure of claim 1, wherein the molding is disposed between the adhesive and the dielectric layer of the RDL.

8. The semiconductor structure of claim 1, wherein the portion of the molding contacts the adhesive, the first underfill, the second underfill, the first die and the second die.

9. The semiconductor structure of claim 1, wherein the support element is disposed over the second surface of the first die and the fourth surface of the second die.

10. The semiconductor structure of claim 9, wherein the support element extends laterally beyond edges of the first die and the second die from a top view.

11. The semiconductor structure of claim 1, wherein a sidewall of the adhesive is vertically aligned with a sidewall of the support element.

12. A semiconductor structure, comprising:
- a first die having a first surface and a second surface opposite to the first surface;
- a second die adjacent to the first die and having a third surface and a fourth surface opposite to the third surface;
- a redistribution layer (RDL) under the first surface of the first die and the third surface of the second die, and including an interconnect structure electrically connected to the first die and the second die;
- a first conductive bump between the RDL and the first surface of the first die;
- a second conductive bump between the RDL and the third surface of the second die;
- a first underfill between the RDL and the first surface of the first die and surrounding the first conductive bump;
- a second underfill between the RDL and the third surface of the second die and surrounding the second conductive bump;
- a molding over the RDL and surrounding the first die and the second die;
- an adhesive over the molding, the second surface of the first die and the fourth surface of the second die; and
- a support element over the molding and the second surface of the first die and the fourth surface of the second die,
- wherein at least a portion of the molding is disposed between the first underfill and the second underfill,
- the portion of the molding is in contact with the first die, the second die, the first underfill and the second underfill,
- a width of the molding is substantially greater than a width of the adhesive,
- the width of the molding is substantially greater than a width of the support element, and
- the width of the adhesive is substantially equal to the width of the support element.

13. The semiconductor structure of claim 12, wherein the support element is in contact with the second surface of the first die.

14. The semiconductor structure of claim 12, wherein the support element is a dummy wafer or a silicon substrate.

15. The semiconductor structure of claim 12, wherein the portion of the molding is disposed between the first die and the second die.

16. The semiconductor structure of claim 15, further comprising:
- a third die disposed under the RDL and electrically connected to the interconnect structure;
- wherein a first portion of the third die overlaps a portion of the first die from a top view, and a second portion of the third die overlaps a portion of the second die from a top view.

17. A semiconductor structure, comprising:
- a redistribution layer (RDL) including an interconnect structure;
- a support element over the RDL;
- a first die having a first surface electrically connected to the interconnect structure and a second surface opposite to the first surface, wherein the first die is disposed between the RDL and the support element;
- a second die having a third surface electrically connected to the interconnect structure and a fourth surface opposite to the third surface, wherein the second die is disposed between the RDL and the support element and adjacent to the first die;
- a first underfill disposed under the first surface of the first die and above the RDL;
- a second underfill disposed under the third surface of the second die and above the RDL; and
- a molding surrounding the first die, the second die, the first underfill and the second underfill, and disposed between the RDL and the support element;
- an adhesive between the support element and the molding,
- wherein a portion of the molding is in contact with the first underfill, the second underfill, the first die and the second die,
- a width of the molding is substantially greater than a width of the adhesive,
- the width of the molding is substantially greater than a width of the support element, and
- the width of the adhesive is substantially equal to the width of the support element.

18. The semiconductor structure of claim 17, wherein the second surface of the first die is coplanar with a surface of the molding.

19. The semiconductor structure of claim 17, wherein a portion of a top surface of the molding is exposed through the support element.

20. The semiconductor structure of claim 17, further comprising:
- a third die disposed under the RDL and electrically connected to the interconnect structure;
- wherein a portion of the RDL is disposed between the first die and the third die, and a portion of the third die overlaps a portion of the first die.

* * * * *